United States Patent
Atishay et al.

(10) Patent No.: US 11,195,568 B1
(45) Date of Patent: Dec. 7, 2021

(54) METHODS AND SYSTEMS FOR CONTROLLING REFRESH OPERATIONS OF A MEMORY DEVICE

(71) Applicant: Samsung Electronics Co., Ltd., Suwon-si (KR)

(72) Inventors: Atishay, Bangalore (IN); Anirudh B K, Bangalore (IN); Rajeev Verma, Bangalore (IN); Vishnu Charan Thummala, Bangalore (IN)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/060,913

(22) Filed: Oct. 1, 2020

(30) Foreign Application Priority Data

Aug. 12, 2020 (IN) .............................. 202041034729

(51) Int. Cl.
　　*G11C 11/406*　　(2006.01)
　　*G11C 29/42*　　(2006.01)
　　*G11C 11/4072*　　(2006.01)

(52) U.S. Cl.
CPC .... *G11C 11/40618* (2013.01); *G11C 11/4072* (2013.01); *G11C 11/40615* (2013.01); *G11C 11/40622* (2013.01); *G11C 11/40626* (2013.01); *G11C 29/42* (2013.01)

(58) Field of Classification Search
CPC ........ G11C 11/40618; G11C 11/40615; G11C 11/40622; G11C 11/40626; G11C 11/4072; G11C 29/42

USPC .......................................................... 365/222
See application file for complete search history.

(56) References Cited

U.S. PATENT DOCUMENTS

| | | | |
|---|---|---|---|
| 5,652,729 | A | 7/1997 | Iwata et al. |
| 6,233,193 | B1 * | 5/2001 | Holland ................ G11C 11/406 |
| | | | 365/222 |
| 6,483,764 | B2 | 11/2002 | Chen Hsu et al. |
| 6,778,457 | B1 | 8/2004 | Burgan |
| 7,272,065 | B2 | 9/2007 | Lovett |
| 9,058,896 | B2 | 6/2015 | Franceschini et al. |
| 9,159,396 | B2 | 10/2015 | Isaac et al. |
| 9,653,142 | B1 | 5/2017 | Kihara |

* cited by examiner

*Primary Examiner* — Son L Mai
(74) *Attorney, Agent, or Firm* — Harness, Dickey & Pierce, P.L.C.

(57) ABSTRACT

Methods and systems for controlling refresh operations of a memory device. A method disclosed herein includes receiving, by a refresh controller of the memory device, a refresh command from a host for performing the refresh operation on a plurality of memory rows. The method further includes selecting, by the refresh controller, at least one memory row from the plurality of memory rows for the refresh operation using a refresh-row selection circuitry. The at least one memory row is selected by performing digital reading or analog reading of at least one row condition cell (RCC) and at least one supplemental cell that are connected to each memory row of the memory rows. The method further includes performing, by the refresh controller, the refresh operation on the selected at least one memory row.

20 Claims, 17 Drawing Sheets

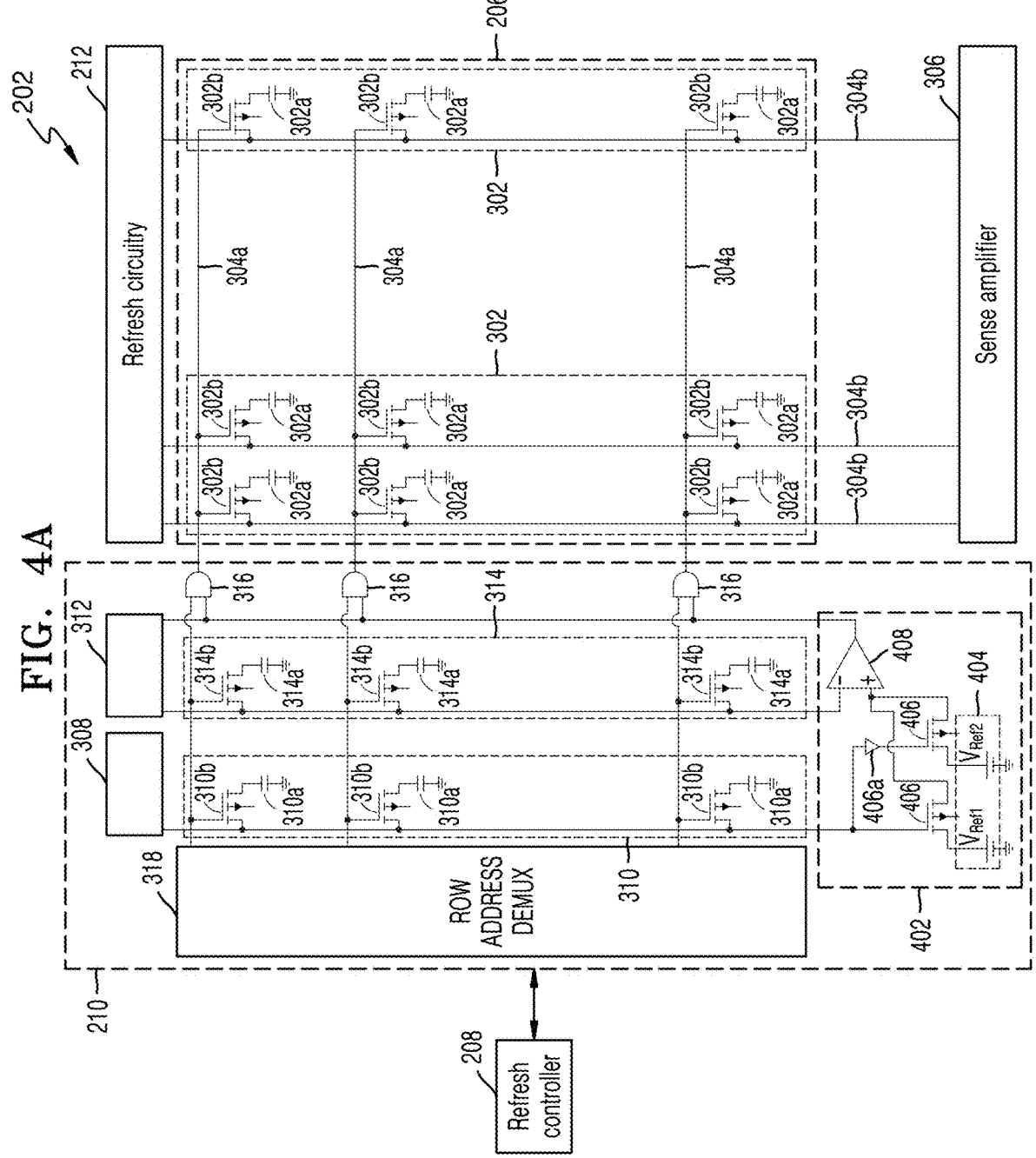

METHODS AND SYSTEMS FOR CONTROLLING REFRESH OPERATIONS OF A MEMORY DEVICE

CROSS-REFERENCE TO RELATED APPLICATIONS

This application claims benefit of priority to Indian Patent Application No. 202041034729 filed on Aug. 12, 2020 in the Indian Intellectual Property Office, the disclosure of which is incorporated herein by reference in its entirety.

BACKGROUND

Example embodiments relate to the field of memory devices, and more particularly, to controlling refresh operations of a memory device.

A memory device such as a volatile memory device (for example; a dynamic random access memory (DRAM) and/or the like) includes a plurality of memory cells. Each memory cell, e.g. each memory cell of a DRAM device, includes a capacitor to store a data bit. A presence or absence of a charge on the capacitor may determine whether the data bit stored is '0' or '1'. The capacitor may lose/leak the charge over time, causing the data bit stored to be lost. Thus, in order to maintain data integrity in the memory device, the charges in the memory cells are restored periodically via a refresh operation. The refresh operation involves reading the charge/data bit from the capacitor of each memory cell and rewriting the data bit (for example: read data) into the capacitor by restoring the charge on the capacitor to its original level.

SUMMARY

Some example embodiments herein disclose methods and/or systems for controlling a refresh operation of a memory device.

Some example embodiments herein disclose methods and/or systems for selecting at least one memory row of a plurality of memory rows in the memory device and performing the refresh operation on the selected at least one memory row.

Some example embodiments herein disclose methods and/or systems for selecting the at least one memory row for the refresh operation by determining conditions of a plurality of memory cells included in each memory row and refresh requirements of the plurality of memory cells included in each memory row.

Some example embodiments herein disclose methods and/or systems for reading at least one data bit of at least one row condition cell (RCC) connected to each memory row to determine the conditions of the plurality of memory cells included in each memory row.

Some example embodiments herein disclose methods and/or systems for reading at least one data bit of at least one supplemental cell connected to each memory row to determine the refresh requirements of the plurality of memory cells included in each memory row.

Some example embodiments herein disclose methods and/or systems for selecting the at least one memory row for the refresh operation by reading comparison voltage stored in the at least one RCC connected to each memory row, and voltage of the at least one supplemental cell connected to each memory row.

Accordingly, some example embodiments herein provide methods and/or systems for controlling the refresh operation of a memory device. A method includes receiving, by a refresh controller from a host, at least one refresh command for a plurality of memory rows in the memory device, wherein each of the plurality of memory rows include a plurality of memory cells, selecting, by a refresh-row selection circuitry, at least one memory row from the plurality of memory rows by reading at least one row condition cell (RCC) and at least one supplemental cell, each of the RCC and the supplemental cell being associated with respective memory rows of the plurality of memory rows, and performing, by the refresh controller, the refresh operation on the selected at least one memory row using a refresh circuitry.

Accordingly, the embodiments herein provide a memory device including at least one memory array including a plurality of memory cells, wherein the plurality of memory cells are arranged on each memory row of a plurality of memory rows, a refresh-row selection circuitry including at least one row condition cell (RCC) connected to a memory row of the plurality of memory rows and at least one supplemental cell connected to the memory row of the plurality of memory rows, and a refresh controller coupled to the refresh-row selection circuitry. the refresh controller is configured to receive at least one refresh command from a host for the plurality of memory rows in the memory device, enable the refresh-row selection circuitry for selecting at least one memory row of the plurality of memory rows by reading the at least one RCC and the at least one supplemental cell that are associated with the memory row of the plurality of memory rows, and perform the refresh operation on the selected at least one memory row using a refresh circuitry.

These and other aspects of the example embodiments herein will be better appreciated and understood when considered in conjunction with the following description and the accompanying drawings. It should be understood, however, that the following descriptions, while indicating example embodiments and numerous specific details thereof, are given by way of illustration and not of limitation. Many changes and modifications may be made within the scope of the example embodiments herein without departing from the spirit thereof, and example embodiments herein include all such modifications.

BRIEF DESCRIPTION OF FIGURES

Example embodiments herein are illustrated in the accompanying drawings, throughout which like reference letters indicate corresponding parts in the various figures. Example embodiments herein will be better understood from the following description with reference to the drawings, in which:

FIGS. 4A and 4B are block diagrams of the memory device for controlling the refresh operation using stored voltage and supplemental cell voltage associated with the memory cells in the memory device, according to some example embodiments as disclosed herein;

DETAILED DESCRIPTION OF EXAMPLE EMBODIMENTS

Example embodiments herein and the various features and advantageous details thereof are explained more fully with reference to non-limiting embodiments that are illustrated in the accompanying drawings and detailed in the following description. Descriptions of well-known components and processing techniques are omitted so as to not unnecessarily obscure the embodiments herein. The description herein is intended merely to facilitate an understanding of ways in which the example embodiments herein can be practiced and to further enable those of ordinary skill in the art to practice the example embodiments herein. Accordingly, this disclosure should not be construed as limiting the scope of the example embodiments herein.

Embodiments herein disclose methods and systems for controlling a refresh operation of a memory device.

Embodiments herein disclose methods and systems for integrating at least one row condition cell (RCC) and at least one supplemental cell to each of a plurality of memory rows in the memory device to control the refresh operation of the memory device.

In conventional approaches, a refresh operation may be performed on memory cell based on/according to a cell retention time. The cell retention time may be a pre-defined time, wherein the pre-defined time can be the time for which the memory cell retains the data bit before loss/leakage. Furthermore, more loss/leakage may occur at a higher operating temperature, The cell retention time can be defined by taking into consideration the worst/weakest memory cell (which may lose the charge at the earliest) in the memory device. In an example, the cell retention time can be defined as 64 milliseconds (ms) or 32 ms for higher temperatures. However, performing the refresh operation based on the cell retention time causes performance degradation because of decreased bandwidth and/or increased power consumption.

Figure 1A:
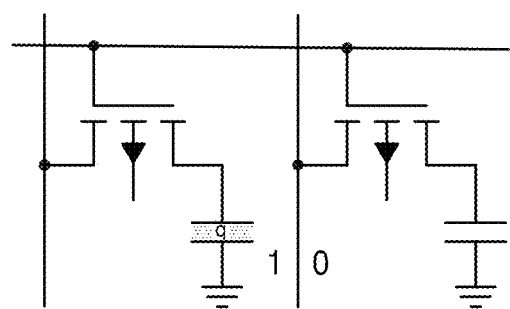
FIG. 1A depicts a memory cell of a memory device.
Figure 1B:
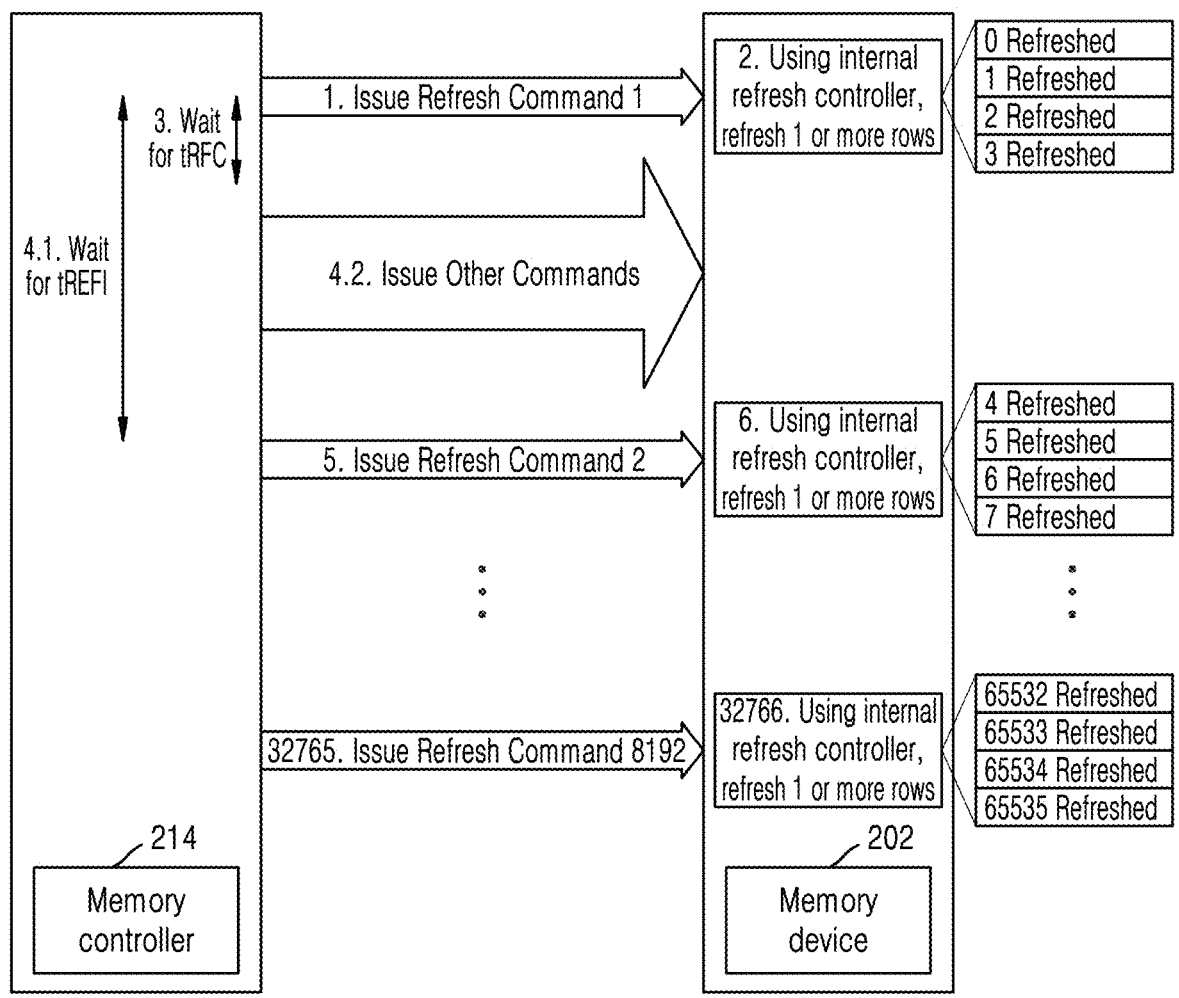
FIG. 1B is an example sequence diagram depicting a conventional method for performing refresh operation on the memory device.

FIG. 1B is an example sequence diagram depicting a conventional method for performing the refresh operation on the memory device coupled to a host. The host includes a memory controller. The memory device includes a plurality of memory cells and a refresh controller. The plurality of memory cells can be arranged in rows (word line) and columns (bit lines). Each of the memory cells includes a capacitor for storing the data bit and a transistor for determining/accessing if the memory cell is currently being accessed for the data bit (as depicted in FIG. 1A). The refresh controller can be configured for refreshing the at least one row including the plurality of memory cells.

The memory controller issues a refresh command to the refresh controller to refresh rows of the memory cells. The memory controller issues the refresh command depending on capacity and configuration of the memory device. Upon receiving the refresh command from the memory controller, the refresh controller initiates a refresh operation on the rows of the memory cells. Meanwhile, the memory controller waits for a refresh cycle time (tRFC). The tRFC time can be maximum time required for the completion of the initiated refresh operation on the rows of the memory cells. Once the tRFC has passed, the memory controller issues other commands (for example; read and/or write commands) to the memory device for performing other operations (for example: read and write operations). The memory controller then waits for periodic refresh interval time (tREFI) (for example; 7.8 microseconds (µs)) in the cell retention time (for example: 64 ms) by tracking time passed since the last refresh command was issued. Once tREFI has passed, the memory controller issues another refresh command to the refresh controller for refreshing a next row or a set of rows.

Figure 1C:
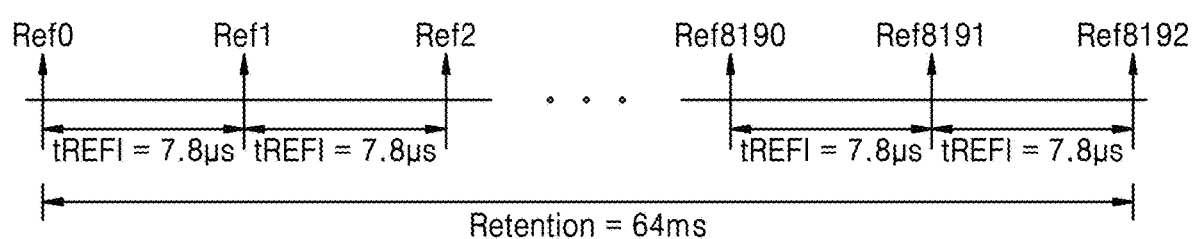
FIG. 1C is an example diagram depicting time intervals for issuing the refresh command to the memory device for performing the refresh operation.

In an example as depicted in FIG. 1C, the memory controller can issue 8192 refresh commands to the refresh controller within the cell retention time (for example: 64 ms or 32 ms). Thus, the memory controller can issue a single refresh command at the tREFI of 7.8 microseconds (µs) or 3.9 µs (for example: tREFI=64 ms/8192=7.8 µs or tREFI 32 ms/8192=3.9 µs) at higher temperatures. However, with increasing densities of the memory cells in the memory device, the time required to refresh the rows of the memory cells may increase, e.g. may increase exponentially for a single refresh command. Therefore, the refresh operations may consume higher bandwidth than a bandwidth utilized for the read and/or write operations, which may decrease the performance of the memory device.

Referring now to FIGS. 2 through 12, where similar reference characters denote corresponding features consistently throughout the figures, there are shown some example embodiments.

Figure 2:
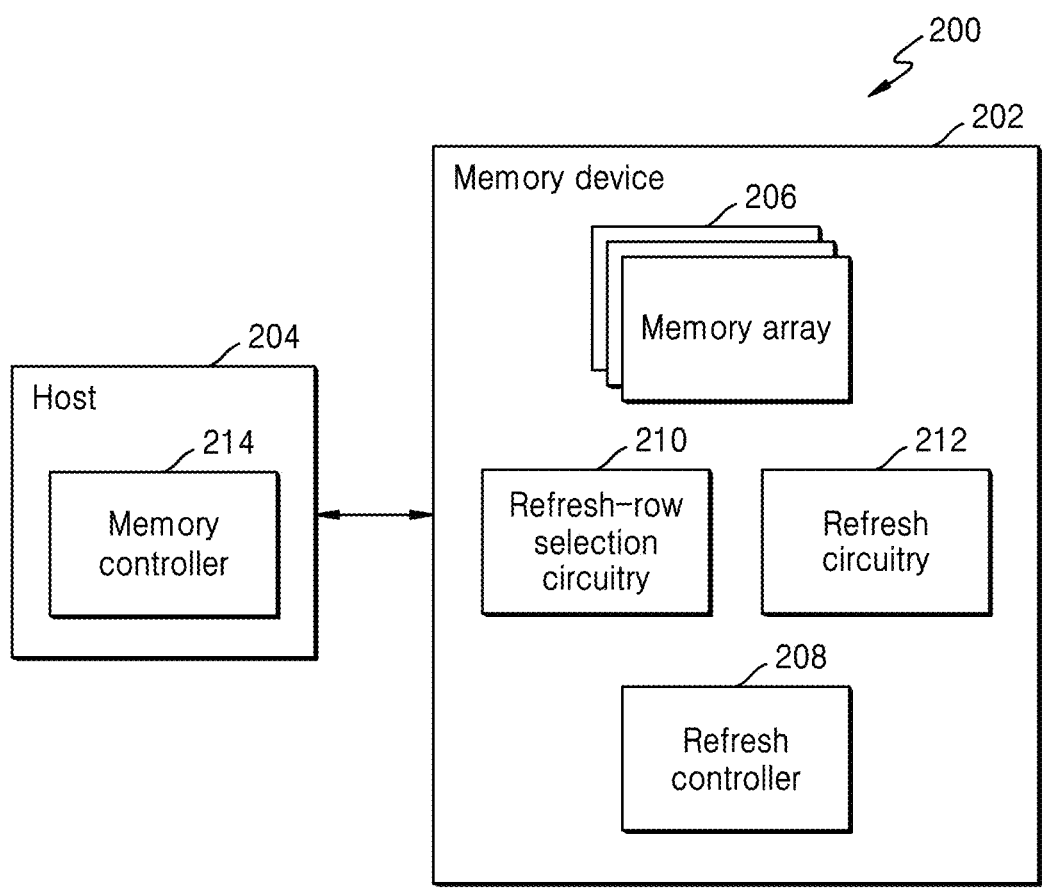
FIG. 2 depicts a memory system, according to some example embodiments as disclosed herein.

FIG. 2 depicts a memory system 200, according to some example embodiments as disclosed herein. The memory system 200 includes at least one memory device 202, and a host 204.

The memory device 202 referred herein can be a volatile semiconductor device configured to store data. The data can be, but is not limited to be, at least one of files, documents, media (for example: text, images, audio, videos, animations, and so on), applications (for example: a calendar application, a call related application, a streaming application, a file downloading related application, a social networking application, a camera application, an IoT related application, a data management application, an Augmented Reality (AR) related application, a gaming related application, and so on) and so on.

In some example embodiments, the memory device 202 can be, but is not limited to, a random access memory or the like. Examples of the random access memory can be, but are not limited to be, a static random-access memory (SRAM), a dynamic random-access memory (DRAM), a Synchronous a graphics random-access memory (SGRAM), a High Bandwidth Memory (HBM), a Magneto resistive random-access memory (MRAM) and so on. In some example embodiments, the memory device 202 can be at least one type of the DRAM such as, but not limited to, a synchronous DRAM (SDRAM), a double data rate synchronous DRAM (DDR SDRAM), a graphics double data rate DRAM (GDDR DRAM), a quad data rate DRAM (QDR DRAM), a video DRAM (VDRAM), an extended data out DRAM (EDO DRAM), a multibank DRAM (MDRAM), and so on. In some example embodiments, the memory device 202 can be at least one of a monolithic memory circuit, a semiconductor die, a stack of memory dies, a chip, a packaged memory circuit, or any other type of tangible memory circuit.

The memory device 202 can communicate with the host 204 over a memory channel/bus. The memory channel may support various protocols such as, but is not limited to being, memory protocols (for example, dual in-line memory module (DIMM) interface, LPDDR, LPDRAM, JEDEC, and so on) Input/Output (I/O) protocols (for example, PCI, InfiniBand, and so on), networking protocols (for example: Ethernet, Transport Control Protocol/Internet Protocol (TCP/IP), and so on), storage protocols (for example: Network File System (NFS), Serial Advanced Technology Attachment (SATA), Serial Attached SCSI (SAS), and so on), wireless protocols, and so on for enabling the memory device 202 to communicate with the host 204.

The memory device 202 includes at least one memory array 206, a refresh controller 208, a refresh-row selection circuitry 210, and a refresh circuitry 212.

The memory array 206 includes a plurality of memory cells 302 (as depicted in FIGS. 3a-4b) for storing the data. The plurality of memory cells 302 can be positioned on an array having a plurality of word lines/rows 304a, and a plurality of bit lines 304b. An intersection of the bit lines 304b and the word lines 304a constitutes/corresponds to the address of the memory cell 302. The data that is being written into or read from the memory cells 302 may be determined based on the bit lines 304b. The word lines/rows can be used for controlling the reading and/or writing of the data from and to the memory cells 302. The data can read/being written from/into the memory cells 302 by applying a signal on the positioned word line 304a. Example embodiments herein use the terms such as "word lines", "rows of memory cells", "memory rows", and so on interchangeably to refer to a wire/physical connection such as a gate, which can be used for controlling the reading and writing of the memory cells 302.

Each memory cell 302 includes one or more capacitors, such as capacitor 302a to store the data as bits '0' or '1' (hereinafter referred as data bit(s)). A charge on the capacitor 302a determines the data bit stored in the capacitor 302a. In order to maintain data integrity and to avoid data loss, the data bits/charge of the memory cells 302 may be restored using a refresh operation. The refresh operation may include reading the charge/data from the capacitors 302a of the memory cells 302 and rewriting read data (for example: the data which can be accessed) into the capacitors 302a by restoring the charge on the capacitors 302a to its original level.

The refresh controller 208 may be configured to control the refresh operation in the memory device 202. In some example embodiments, the refresh controller 208 controls the refresh operation by selecting the one or more memory rows 304a for the refresh operation, and performing the refresh operation on the selected one or more memory rows 304a sequentially, e.g. in a predetermined (or, alternatively, variable) order. In some example embodiments, performing the refresh operation on the selected one or more memory rows 304a refers to restoring the charge/data bits of the memory cells 302 positioned on the selected one or more memory rows 304a. The refresh operation may include reading the data bits of the memory cells 302 and rewriting the data bits into the memory cells 302.

The refresh controller 208 may also be configured to enable the refresh-row selection circuitry 210 for selecting the one or more memory rows 304a for the refresh operation, wherein the refresh operation may be performed on only one selected row at a time. In some example embodiments, the refresh-row selection circuitry 210 may select the one or more memory rows 304a for the refresh operation by determining conditions of the memory cells 302 positioned on the one or more memory rows 304a, and determining time period (hereinafter referred as a refresh cycle) corresponding to a time of a refresh operation performed on the one or more memory rows 304a. In some example embodiments, the refresh controller 208 may select the one or more memory rows 304a for the refresh operation based on a combination of voltage storage and supplemental cell voltage associated with the one or more memory rows 304a. After selecting the one or more memory rows 304a, the refresh-row selection circuitry 210 may activate the selected one or more memory rows 304a for the refresh operation.

The refresh controller 208 may also be configured to enable the refresh circuitry 212 to perform the refresh operation on the activated/selected one or more memory rows 304a one by one, and to skip the refresh operation on the memory rows 304a that have not been activated/selected. In some example embodiments, the only one selected memory row 304a may be refreshed at a time based on the specification/design of the memory device 202. The refresh circuitry 212 performs the refresh operation by reading the charge/data from the capacitors 302a of the memory cells 302 positioned on the selected one or more memory rows 304a and rewrites read data (for example: the data which can be accessed) into the cells by restoring the charge in the capacitors 302a to their previous level.

The host 204 referred herein can be at least one of a processor, a System on Chip (SoC), a server, an integrated chip (IC), a chipset, a mobile computing device, a mobile phone, a smartphone, a tablet, a phablet, a personal digital assistant (PDA), a laptop, a computer, a wearable device, an IoT (Internet of Things) device, a wearable computing device, a vehicle infotainment system, a medical device, a camera, an application processor (AP), a multiprocessor system, a microprocessor based programmable consumer electronics, a network computer, a minicomputer, a mainframe computer, and/or any other device which supports the at least one memory device 202.

The host 204 may include a memory controller 214. The host 204 may also include components such as, but not limited to, a Central Processing Unit (CPU)/processor, a memory copy accelerator block, an Input/Output (I/O) ports, and so on (not shown). The memory controller 214 may be configured to control operations of the at least one memory device 202 by maintaining information about the at least one memory device 202. Examples of operations can be, but are not limited to, reading the data from the at least one memory device 202, writing the data to the at least one memory device 202, initiating the refresh operation to refresh the at least one memory device 202, and so on. The information can be at least one of a number of memory devices 202 coupled to the host 204, capacity and/or configuration of the at least one memory device 202, the data stored in the at least one memory array 206 of the memory device 202, locations/addresses of the stored data within the at least one memory array 206, time defined for performing the at least one operation in the memory device 202, or the like.

For performing the refresh operation, the memory controller 214 of the host 208 may issue a refresh command to the refresh controller 208 of the memory device 202, indicating the memory rows 304a of the at least one memory array 206 are to be refreshed. The memory device 202 may indicate memory rows 304a for the refresh operation based on the capacity and/or configuration of the at least one memory device 202. The memory controller 214 may issue the refresh command at periodic refresh intervals, e.g. in periods of time tREFI based on the cell retention time. The cell retention time may be the time that the memory cells 302 of the memory array 206 can retain the data before data loss/charge leakage. The tREFI and the cell retention time may be variable or pre-defined based on standard/specification of the memory device 202. In some example embodiments, the cell retention time can be 64 milliseconds(ms) or 32 ms for higher temperatures. The range of temperature may vary based on the type of the memory device 202. In some example embodiments, the cell retention time can be 64 ms or 30 ms for a temperature range of 85° Celsius. In an example, the tREFI can be 7.8 microseconds(µs) for the cell retention time of 64 ms, so that the memory controller 214 can issue the refresh command to the memory device 202 for every 7.8 µs. In an example, the tREFI can be defined as 3.9 µs for the cell retention time of 32 ms, so that the memory controller 214 can issue the refresh command to the memory device 202 for every 3.9 µs.

Upon receiving the refresh command from the memory controller 214, the refresh controller 208 enables the refresh-row selection circuitry 210 to select the one or more memory rows 304a from the memory rows 304a indicated for the refresh operation in the refresh command. In some example embodiments, the one or more memory rows 304a can be selected based on the conditions and/or refresh requirements of the memory cells 302 included in the memory rows 304a, and/or based on the combination of storage voltage and supplemental cell voltage associated with the one or more memory rows 304a. The refresh-row selection circuitry 210 may enable the selected one or more memory rows 304a to be active. Once the one or more memory rows 304a are selected for the refresh operation, the refresh controller 208 enables the refresh circuitry 212 to perform the refresh operation on the selected/activated one or memory rows 304a, and skip the refresh operation on the one or more memory rows 304a that have not been selected/activated for the refresh operation. After performing the refresh operation on the selected one or more memory rows 304a, the refresh controller 208 issues a skip command/indication to the memory controller 214. The refresh controller 208 issues the skip command as an acknowledgement to the memory controller 214 indicating a completion of the refresh operation on the indicated memory rows 304a.

Upon receiving the skip command from the refresh controller 208, the memory controller 214 determines that the one or more rows of the memory device 202 is refreshed (i.e., the memory device 202 is free). The memory controller 214 then issues other commands (such as, but not limited to, read and/or write commands, or the like) to a relevant internal circuitry (not shown) of the memory device 202 for performing the other operations (such as, but not limited to, the read and write operations, or the like). The memory controller 214 also tracks times associated with tREFI, e.g. time since the last refresh command is issued. Once the tREFI has passed, the memory controller 214 issues another refresh command to the refresh controller 208 for performing the refresh operation on the other memory rows 304a. Thus, selective refreshing of the one or more memory rows 304a may lower the wait time of the memory controller 214, bandwidth and time required for the refresh operation.

In some example embodiments, if the refresh selection circuitry 210 selects all the memory rows 304a indicated in the refresh command for the refresh operation, then the refresh controller 208 enables the refresh circuitry 212 to perform the refresh operation on all the memory rows 304a. Further, the refresh controller 208 does not issue the refresh skip command to the memory controller 214 if all of the indicated memory rows 304a have been selected for the refresh operation. In such a case, the memory controller 214 waits for refresh cycle time (tRFC), which can be a large, e.g. a maximum time required to refresh all the memory rows 304a. The tRFC can be based on the specification of the memory device 202; however, example embodiments are not limited thereto. Once the tRFC time has passed, the memory controller 214 determines the completion of the refresh operation and issues one or more commands to the relevant internal circuitry of the memory device 202 for performing one or more operations. The memory controller 214 then may wait for the tREFI time and may issue another refresh command to refresh another set of memory rows 304a, once the tREFI has passed.

FIG. 2 show example blocks of the memory system 200, but it is to be understood that example embodiments are not limited thereon. In some example embodiments, the memory system 200 may include less or more number of blocks. Further, the labels or names of the blocks are used only for illustrative purpose and does not limit the scope of example embodiments herein. One or more blocks can be combined together to perform same or substantially similar function in the memory system 200.

Figure 3A:
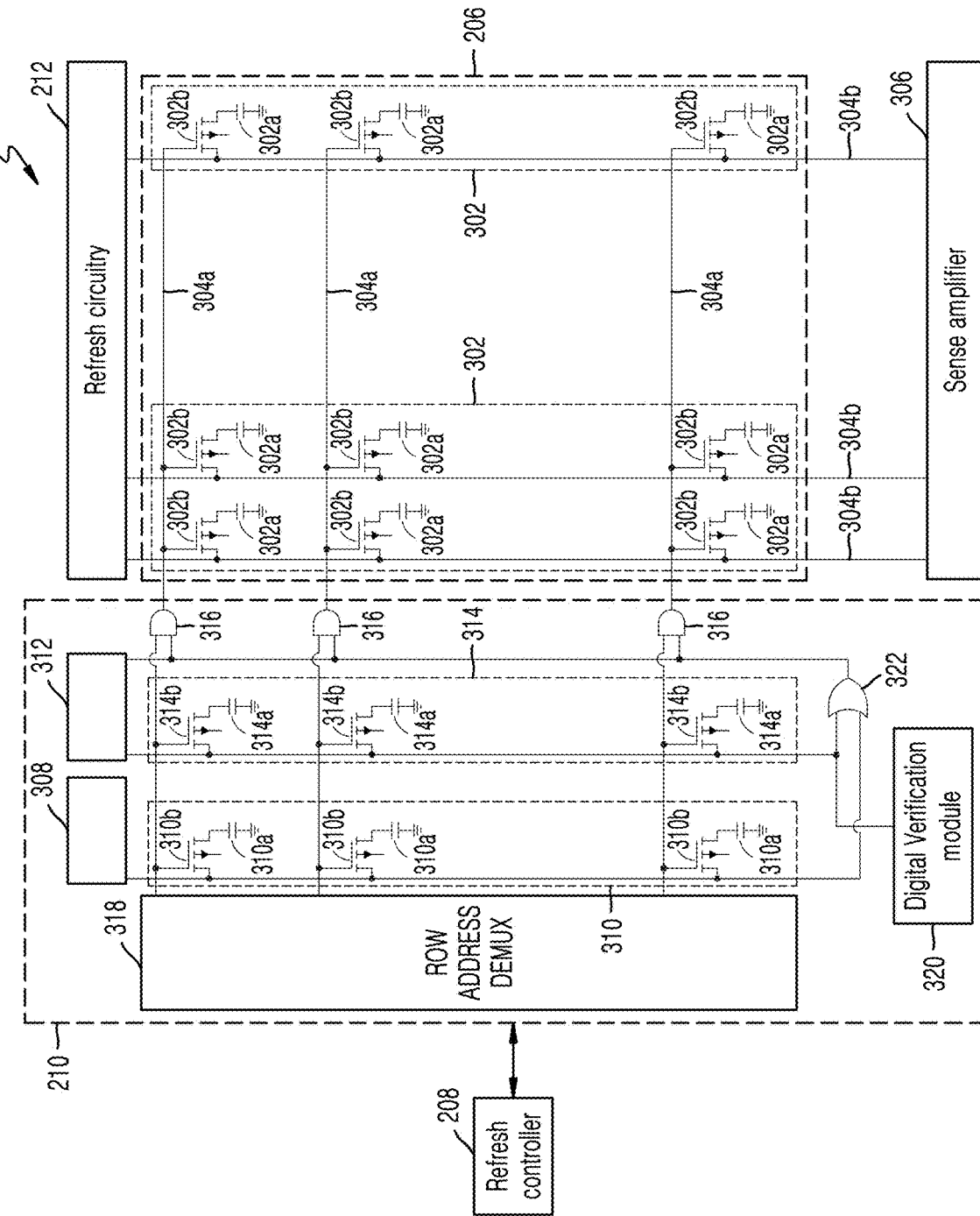
FIGS. 3A and 3B are block diagrams of the memory device for controlling the refresh operation based on conditions and refresh requirements of memory cells in the memory device, according to some example embodiments as disclosed herein.
Figure 3B:
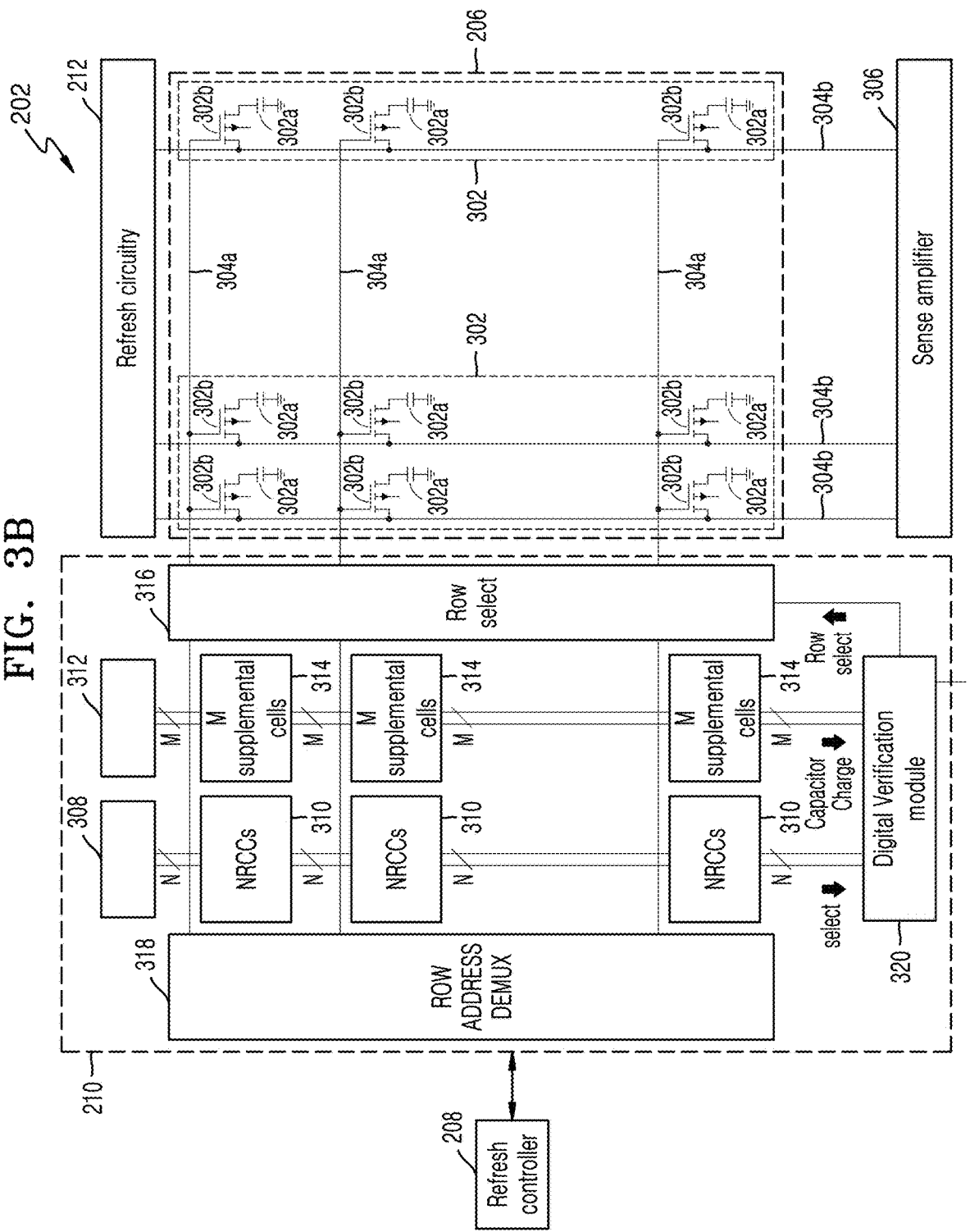

FIGS. 3a and 3b are block diagrams of the memory device 202 for controlling the refresh operation based on the conditions of the memory cells 302 and the refresh cycle, according to some example embodiments as disclosed herein.

The memory device 202 includes the memory array 206, at least one sense amplifier such as sense amplifier 306, the refresh controller 208, the refresh-row selection circuitry 210, and the refresh circuitry 212. In some example embodiments, the refresh-row selection circuitry 210 includes a row address de-multiplexer (row address DEMUX) 318, a row condition circuitry 308, a supplementary reload circuitry 312, and a digital verification module 320.

The memory array 206 includes the plurality of memory cells 302, which can be positioned on the plurality of memory rows/word lines 304a, and the plurality of bit lines 304b. In some example embodiments, the memory array 206 may include 'm' memory rows 304a, and 'n' bit lines 304b, such that memory array 206 includes (m×n) memory cells 302. Each memory cell 302 includes the capacitor 302a and a transistor 302*b*. The capacitor 302*a* can be configured to store the data bits and the level of charge of the capacitor 302*a* determines the data bit stored in the capacitor 302*a*. For example, a presence of the charge on the capacitor 302*a* determines that the data bit stored in the capacitor 302*a* may be a '1' and an absence of the charge on the capacitor 302*a* determines that the data bit stored in the capacitor 302*a* may be '0'. Alternatively, a presence of the charge on the capacitor 302*a* may indicate that the data bit stored in the capacitor is a '0' and an absence of charge stored on the capacitor may indicate that the data bit stored in the capacitor is a '1'. The transistor 302*b* can determine if the associated memory cell 302 is currently accessed for the data. Further, the data bits/charge can be read/being written from/into the capacitor 302*a* of the memory cell 302 by activating/enabling the corresponding memory row 304*a*.

The sense amplifier 306 may be coupled with the memory cells 302 of the at least one memory array 206 using the bit lines. The sense amplifier 306 may be enabled (by a relevant internal circuitry of the memory device 202 (not shown)) when the data is to read from the memory array 206. The sense amplifier 306 senses low voltage signals from the bit lines that represent the data bits ('1' or '0') stored in the memory cell 302, and amplifies the sensed low voltage signal to recognizable logic levels, so that the data can be interpreted/read properly by the host 204.

The row condition circuitry 308 and the supplementary reload circuitry 312 may be coupled with the memory array 206 using a logical gate circuitry 316. The row condition circuitry 308 includes one or more row condition cells (RCCs) 310 that can be connected to each memory row 304*a* using the logical gate circuitry 316. In some example embodiments, the row condition circuitry 308 may include a single RCC 310 for the memory row 304*a* as depicted in FIG. 3A. In some example embodiments, the logical gate circuitry 316 coupling the row condition circuitry 308 with the memory row 304*a* of the memory array 206 may involve a simple AND gate logic as depicted in FIG. 3A. In some example embodiments, the row condition circuitry 308 may include the plurality of RCCs 310 for the memory row 304*a* as depicted in FIG. 3B. In some example embodiments, the logical gate circuitry 316 coupling the row condition circuitry 308 with the memory row 304*a* of the memory array 206 may involve complex logic for selecting the memory row 304*a* as depicted in FIG. 3*a*. For example, the row condition circuitry 308 may include 'N' RCCs 310 for the single memory row 304*a*, as depicted in FIG. 3B. In some example embodiments, the one or more RCCs 310 may be volatile or non-volatile in nature. The one or more RCCs 310 may also be refreshed, if the one or more RCCs 310 is volatile in nature.

The RCCs 310 may be the same as the memory cells 302 of the memory array 206. The RCC 310 may include a capacitor 310*a* and a transistor 310*b*. The capacitor 310*a* of the RCC 310 can be configured to store the data bits '1' or '0'. The charge/voltage on the capacitor 310*a* of the RCC 310 may determine the stored data bits. The transistor 310*b* may determined/control access to the associated memory RCC 310. Alternatively or additionally, the RCCs 310 may include or correspond to fuses and/or antifuses that are open/closed. The fuses/antifuses may be set, e.g. may be blown, such that the RCCs 310 are non-volatile.

In some example embodiments, the RCCs 310 may be used to classify the respectively connected memory rows 304*a* into one or more conditions. The charge/data bits present on the capacitors 310*a* of the RCCs 310 can be used to classify their respectively connected memory rows 304*a* into one or more conditions. The conditions referred herein can be, but is not limited to, a best row, a good row, a bad row, an average row, and so on. The conditions of the memory row 304*a* may indicate a rate and/or a grade of the time in which the memory cells 302 positioned on the corresponding row 304*a* loses the data. In some example embodiments, the number of conditions may vary based on the number of RCCs 310 connected to each memory row 304*a*. For example, 'N' number of RCCs 310 can be used to classify the associated memory row 304*a* into up to $2^N$ conditions.

In some example embodiments, if a single RCC 310 is connected to the memory row 304*a* (as depicted in FIG. 3A), then the RCC 310 can store only '1' or '0' (i.e. 2 data bits), so that the data bit of the RCC 310 can be used to classify the connected memory row 304*a* into one of two conditions. For example, consider an example scenario, wherein the single RCC 310 is connected to the memory row 304*a*. In such a case, if the RCC 310 stores the charge/data bit of '1', then the memory row 304*a* connected to the corresponding RCC 310 may be classified as the good row. If the RCC 310 stores the charge/data bit of '0', then the memory row 304*a* connected to the corresponding RCC 310 can be classified as the bad row. In some example embodiments, a good row may correspond to a row having a better refresh/retention performance than a bad row. For example, each of the cell a good row may be able to maintain charge for longer than a predetermined (or, alternatively, variable) threshold, and each of the cells in a bad row may not be able to maintain charge for longer than the threshold. In some example embodiments, the good rows may correspond to rows wherein an average refresh and/or retention performance of all cells on the good rows is better than a variable (or, alternatively, predetermined) threshold, and the bad rows may correspond to rows wherein an average refresh and/or retention performance of all cells on the bad rows is less than the threshold.

In some example embodiments, if the two RCCs 310 are connected to the single memory row 304*a*, then the two RCCs 310 can store "00", or "01" or "10", or "11" data bits (i.e. 4 data bits) using the capacitors 310*a* and/or fuses/antifuses (not shown). Therefore, the two RCCs 310 can be used to classify the connected memory row 304*a* into one of the four conditions. Consider an example scenario, wherein the two RCCs 310 (a RCC 1, and a RCC 2) are connected to the single memory row 304*a*. In such a case, if the RCCs 1 and 2 store the charge/data bit of '0', then the memory row 304*a* connected to the corresponding RCCs 1 and 2 can be classified as a bad row. If the RCC 1 stores the charge/data bit of '0' and the RCC '2' stores the charge/data bit of '1', then the memory row 304*a* connected to the corresponding RCCs 1 and 2 can be classified as the average row. If the RCC 1 stores the charge/data of '1' and the RCC '2' stores the charge/data of '0', then the memory row 304*a* connected to the corresponding RCCs 1 and 2 can be classified as a good row. If the RCC 1 stores the charge/data of '1' and the RCC '2' stores the charge/data of '1', then the memory row 304*a* connected to the corresponding RCCs 1 and 2 can be classified into a best row. Embodiments herein use the terms such as, but not limited to, "RCCs", "refresh cells", "voltage storage cells (VCSs)", and so on interchangeably, to refer to cell(s) that can be connected to each memory row 304*a* for depicting the conditions of the corresponding memory row 304*a*.

In some example embodiments, the plurality of RCCs 310 can be divided into different groups for determining the conditions at different temperature ranges. For example, first two (least significant) data bits of the RCCs 310 may be used for determining the condition of the connected memory row 304a at lower temperatures, and a last bit (most significant) of the RCCs 310 can be used for determining the condition of the connected memory row 304a at higher temperatures; however, example embodiments are not limited thereto, and other bits may correspond to refresh capabilities/performance of the memory row 304a based on temperature. In an example herein, the temperature ranging below 65° Celsius may be considered as the lower temperature range, and the temperature ranging above 65° Celsius may be considered as the higher temperature range.

In some example embodiments, the host 204 may pre-initialize the data bits/charge/voltage of the RCC(s) 310 based on cell retention criteria/dual in-line memory module (DIMM) data. The retention criteria may include information such as, but not limited to, a retention profiling mechanism suited to identify the weak memory cells 302 (the memory cells 302 that can lose the data/leak the charge at the earliest) in each memory row 304a, a number of rounds of testing required/used to identify the weak memory cells 302, a retention time test to determine whether each memory row 304a can be refreshed at a normal rate or not, and so on. The cell retention criteria for the memory device 202 may be determined by testing the memory device 202 during manufacturing/fabrication of the memory device 202. The cell retention criteria may be maintained/provided in the memory device 202 after the testing, e.g. maintained in a non-volatile portion of the memory device 202, such as in a fuse/antifuse bank. Once the memory device 202 initializes/boots up, a basic input/output system (BIOS) of the host 204 (not shown) accesses the cell retention criteria maintained in the memory device 202. Thereafter, the host 204 performs the testing on the memory device 202 using the accessed cell retention criteria. In some example embodiments, the host 204 may use a Memory Built-In Self Test (MBIST) module and/or any other module/device with similar capabilities to increase speed of testing of the memory device 202. During the testing, the host 204 may initialize the data bits or voltage of the one or more RCCs 310 connected to the memory rows 304a upon determining whether or not the memory cells 302 positioned on the corresponding memory rows 304a have passed the accessed cell retention criteria. The host 204 may initialize the data bits, e.g. voltage of the one or more RCCs 310 using mode register (MR) commands. In some example embodiments, the MR commands can be special commands that are similar to normal MR commands, which can be used to operate the memory device 202 in a target row refresh (TRR) mode and/or the like, wherein the normal read and write operations cannot be performed. In some example embodiments, the MR commands used to initialize the data bits or the voltage of the RCC(s) 310 can be implemented with the normal MR commands used to operate the memory device in the TRR mode or the like.

The host 204 may also re-initialize the data bits or the voltage or value of the RCC(s) 310. In some example embodiments, the digital verification module 320 may also re-initialize the data bits or the voltage or value of the RCCs 310. The data bits/voltage of the RCCs 310 can be initialized in order to mark the memory rows 304a that are connected to the RCCs 310 are bad rows, which require the refresh operation on each cycle.

In some example embodiments, the host 204/digital verification module 320 can re-initialize the data bits of the one or more RCCs 310 on detecting an occurrence of Error Correction Code (ECC) errors by the host 204. In some example embodiments, the digital verification module 320 can re-initialize the data bits of the RCCs 310 on board using methods/techniques, such as, but not limited to, a single bit correction method, a double bit error detection method (SECDED ECC), and so on. In an embodiment, the digital verification module 320 may use any methods/techniques that are defined in the specification of the memory device 202 to initialize the data bits/voltage of the RCCs 310 on-board.

When the ECC errors occur for a particular memory row 304a, the host 204/digital verification module 320 may treat the corresponding memory row 304a as a bad/worst row, and may re-initialize the data bits of the one or more RCCs 310 connected to the corresponding memory row 304a. For example, the host 204 can re-initialize the data bit of the RCC 310 from '1' to '0', when the ECC errors occur for the memory row 304a connected to the corresponding RCC 310, therefore the corresponding memory row 304a cannot be skipped from the refresh operation.

In some example embodiments, the host 204 can re-initialize the data bits of the one or more RCCs 310 by performing a scrub method. For example, the host 204 can perform the scrub method, when temperature of the memory device 202 crosses above a temperature threshold (that may be variable, or, alternatively, may have been pre-defined based on the specification of the memory device 202). In some example embodiments, the host 204 can perform the scrub method at variable, or alternatively, pre-defined regular intervals. The scrub method includes reading the ECC from each location of the memory device 202, correcting bits errors if the bit errors are present within the ECC, and writing the corrected data bits back to the read each location of the memory device 202. The scrub method can be used to prevent crashes and errors in large-scale server farms 204, wherein probability of failures is high due to presence of a large number of memory devices 202.

The supplementary reload circuitry 312 may include one or more supplemental cells 314 that can be connected to each memory row 304a using the logical gate circuitry 316. In some example embodiments, the supplementary reload circuitry 312 includes the single supplemental cell 314 for the memory row 304a, as depicted in FIG. 3A. In some example embodiments, the logical gate circuitry 316 can include a simple AND logic as depicted in FIG. 3A. In some example embodiments, the supplementary reload circuitry 312 includes a plurality of supplemental cells 314 for the single memory row 304a, as depicted in FIG. 3B. For example, the supplementary reload circuitry 312 can include 'M' supplemental cells 314 for the single memory row 304a, as depicted in FIG. 3B. In an embodiment, the one or more supplemental cells 314 can be volatile cells. The one or more supplemental cells 314 can also be refreshed after refreshing the memory row 304a connected to the corresponding one or more supplemental cells 314.

The one or more supplemental cells 314 can be same as the memory cells 302 of the memory array 206; however, example embodiments are not limited thereto. The supplemental cell 314 may include a capacitor 314a and a transistor 314b; alternatively or additionally, the supplemental cell 314 may include a fuse/antifuse (not shown). The capacitor 314a of the supplemental cell 314 can be configured to store the data bit '1' or '0'. The charge/voltage on the capacitor 314a of the supplemental cell 314 may be used to determine the stored data bits. The charge/voltage stored on the capacitor 314a of the supplemental cell 314 may be referred hereinafter as a supplemental charge/voltage. The transistor 314*b* of the supplemental cell 314 controls access of the data from the corresponding supplemental cell 314.

In some example embodiments, the one or more supplemental cells 314 can be used to determine the refresh requirements for corresponding memory rows 304*a*. The refresh requirements may decide whether the memory cells 302 positioned on the memory rows 304*a* are to be refreshed or not, based on the charge/data bits/voltage stored in the capacitors 314*a* of the one or more supplemental cells 314. The data bits/voltage/charge of the capacitors 314*a* of the one or more supplemental cells 314 may be set by the digital verification module 320 after performing the refresh operation on the associated memory row 304*a* in each refresh cycle. In some example embodiments, a number of supplemental cells 314 included in the supplementary reload circuitry 312 may depict/correspond to the refresh requirements of the rows of the memory cells 302 for one or more refresh cycles. For example, the single supplemental cell 314 connected to the memory row 304*a* can depict the refresh requirements for the corresponding memory row 304*a* only for one refresh cycle. The two supplemental cells 314 connected to the memory row 304*a* can depict the refresh requirements for the corresponding memory row 304*a* for a larger number, e.g. a maximum of three refresh cycles.

For example, consider an example scenario, wherein the single supplemental cell 314 is connected to the memory row 304*a*. In such a case, if the supplemental cell 314 stores the supplemental charge/voltage of '1', then the memory row 304*a* connected to the corresponding supplemental cell 314 is to be refreshed for one refresh cycle. If the supplemental cell 314 stores the supplemental charge/voltage of '0', then the memory row 304*a* connected to the corresponding supplemental cell 314 may be skipped from the refresh operation for one refresh cycle.

Alternatively, consider an example scenario, wherein two supplemental cells 314 (a supplemental cell 1, and a supplemental cell 2) are connected to the memory row 304*a*. In such a case, if the supplemental cell 1 and the supplemental cell 2 store the supplemental charge/voltage/data bit of '0', then the memory row 304*a* connected to the corresponding supplemental cell 314 is to be refreshed for one refresh cycle. If the supplemental cell 1 stores the supplemental charge/voltage/data bit of '0', and the supplemental cell 2 stores the supplemental charge/voltage/data bit of '1', then the memory row 304*a* connected to the corresponding supplemental cells 1 and 2 may be skipped from the refresh operation for the two refresh cycles. If the supplemental cell 1 stores the supplemental charge/voltage/data bit of '1', and the supplemental cell 2 stores the supplemental charge/voltage/data bit of '0', then the memory row 304*a* connected to the corresponding supplemental cells 1 and 2 may be skipped from the refresh operation for three refresh cycles. If the supplemental cell 1 stores the supplemental charge/voltage/data bit of '1', and the supplemental cell 2 stores the supplemental charge/voltage/data bit of '1', then the memory row 304*a* connected to the corresponding supplemental cells 1 and 2 may be skipped from the refresh operation for four refresh cycles.

The row address DEMUX 318 may be configured to activate the one or more memory rows 304*a* that are indicated by the memory controller 214 of the host 204 for the refresh operation. The row address DEMUX 318 receives row address(es) from the memory controller 214 through a relevant internal circuitry of the memory device 202 (not shown), wherein the row address(es) can correspond to the memory rows 304*a* that have to be refreshed.

The row address DEMUX 318 may activate the memory rows 304*a* corresponding to the received row address(es) by applying a signal '1' on the memory rows 304*a*.

The digital verification module 320 may be coupled with the row condition circuitry 308 and the supplementary reload circuitry 312 using a logical OR gate mechanism 322. In some example embodiments, the logical OR gate mechanism 322 involves a simple OR logic if the single supplemental cell 314 is connected to the memory row 304*a*. In some example embodiments, the logical OR gate mechanism 322 involves a complicated logic if the multiple supplemental cells 314 are connected to the memory row 304*a*.

The digital verification module 320 may be configured to initialize/set the data bits/values/voltage of the supplemental cell 314 by determining if the refresh operation is performed on each memory row 304*a* that is connected to the corresponding supplemental cell 314 in each refresh cycle.

For example, consider an example scenario, wherein the single supplemental cell 314 is connected to the memory row 304*a*. In such a case, the digital verification module 320 determines the data bit to be initialized on the supplemental cell 314 by determining if the refresh operation is performed on the memory row 304*a* that is connected to the corresponding supplemental cell 314 based on the associated current data bit. The digital verification module 320 then updates the determined data bit to be initialized on the supplemental cell 314 to the logical OR gate mechanism 322. In some example embodiments, the digital verification module 320 may set the data bit of the supplemental cell 314 to '0', if the refresh operation is performed on the memory row 304*a* connected to the supplemental cell 314 in the current refresh cycle (e.g. the current data bit of the supplemental cell 314 is '1'). Thereby, updating the data bit of the supplemental cell 314 from '0' to '1' may indicate that the refresh operation can be skipped for the memory row 304*a* in the next refresh cycle. The digital verification module 320 may set the data bit of the supplemental cell 314 to '1', if the refresh operation is not performed on the memory row 304*a* connected to the supplemental cell 314 (e.g. the current data bit of the supplemental cell 314 is '0'). Thereby, updating the data bit of the supplemental cell 314 from '1' to '0' indicates that the refresh operation has to be performed for the memory row 304*a* in the next refresh cycle. In an embodiment, the digital verification module 320 updates the data bits to be initialized on the supplemental cells 314 to the logical OR gate mechanism 322.

For example, consider an example scenario, wherein two supplemental cells 314 (a supplemental cell 1, and a supplemental cell 2) are connected to the memory row 304*a*. In such a case, the digital verification module 320 determines the data bits to be initialized on the supplemental cells 314 by determining if the refresh operation is performed on the memory row 304*a* that is connected to the corresponding supplemental cell 314 based on the associated current data bits. The digital verification module 320 then provides an output, which can be combined with the output of the RCCs 310 with either the simple OR logic or the complicated logic of the logical OR gate mechanism 322. The output provided by the digital verification module 320 can correspond to the data bits determined to be initialized on the supplemental cells 314. In some example embodiments, the digital verification module 320 may set the data bits of the supplemental cells 1 and 2 to '01' or "10", or "11", if the refresh operation is performed on the memory row 304*a* connected to the supplemental cells 1 and 2 once in the four refresh cycles (the current data bits of the supplemental cells 314 may be "00"). Thereby, an indication may be that the refresh operation may be skipped for the memory row 304a in the next two or three or four refresh cycles.

The digital verification module 320 can also be configured to write the data bits/values to the supplemental cells 314, if the associated memory row 304a is refreshed and/or if the data is read from the associated memory row 304a, or if the data is written into the associated memory row 304a. For example, the digital verification module 320 may write '0' (the data bit) to the supplemental cell 314, if the memory row 304a connected to the corresponding supplemental cell 314 is refreshed, which indicates that the memory row 304a has been refreshed.

The digital verification module 320 may also be configured to select the one or more memory rows 304a for the refresh operation. In some example embodiments, the digital verification module 320 selects the one or more memory rows 304a based on the conditions of the one or more memory rows 304a and the refresh requirements of the memory cells 302. The digital verification module 320 may determine the conditions of the one or more memory rows 304a by checking the data bits of the one or more RCCs 310 that are connected to the corresponding one or more memory rows 304a. The digital verification module 320 that determine the refresh requirements by checking the data bits of the one or more supplemental cells 314 that are connected to the corresponding one or more memory rows 304a. Based on the determined conditions and refresh requirements of each memory rows 304a, the digital verification module 320 selects the one or more memory rows 304a for the refresh operation.

In some example embodiments, the digital verification module 320 may select the memory row 304a for the refresh operation, if the memory row 304a is a "bad" row and the memory row 304a has not been refreshed from the long time/refresh cycle. In some example embodiments, the digital verification module 320 may not select the memory row 304a for the refresh operation, if the memory row 304a is a "good" row and the memory row 304a has been refreshed in a previous refresh cycle. In some example embodiments, the digital verification module 320 may select the memory row 304a for the refresh operation, if the memory row 304a is a "good" row and the memory row 304a has not been refreshed from the long time.

The refresh controller 208 may be configured to enable the digital verification module 320 to select the one or more memory rows 304a for the refresh operation. The refresh controller 208 may also be configured to enable the refresh circuitry 212 to perform the refresh operation on the selected one or more memory rows 304a.

For performing the refresh operation on the memory device 202, the memory controller 214 issues the refresh command and the row addresses (corresponding to the set of memory rows 304a that are to be refreshed) to the memory device 202. At the memory device 202, the refresh controller 208 receives the refresh command of the memory controller 214 through the relevant internal circuitry (not shown) of the memory device 202. The refresh controller 208 provides the received row addresses to the row address DEMUX 318. On receiving the row addresses, the row address DEMUX 318 activates the set of memory rows 304a that correspond to the received row addresses.

Upon activating the set of memory rows 304a, the digital verification module 320 selects the one or more memory rows 304a from the activated set of memory rows 304a for the refresh operation. The digital verification module 320 may select the one or more memory rows 304a by performing a digital reading of the data bit(s) of the RCC(s) 310 connected to each of the identified set of memory rows 304a, and the data bit(s) of the supplemental cell(s) 314 connected to each of the identified set of memory rows 304a. The digital verification module 320 may determine the conditions of each memory row 304a based on the read data bit(s) of the RCC(s) 310. The digital verification module 320 may determine the refresh requirements of each memory row 304a based on the read data bit(s) of the supplemental cells 314. The digital verification module 320 then may select the one or more rows from the identified set of memory rows 304a for the refresh operation using the determined conditions and refresh requirements of each memory row 304a. The digital verification module 320 may further allow the selected one or more memory rows 304a to be active for the refresh operation. The digital verification module 320 may enable the row address DEMUX 318 to inactivate the one or more memory rows 304a that are not selected for the refresh operation by blocking the signal 1 on the selected one or more memory rows 304a. The digital verification module 320 may further enable the row address DEMUX 318 to activate the selected one or memory rows 304a, if the selected one or more memory rows 304a are not active.

Upon activating the selected one or more memory rows 304a, the refresh controller 208 may enable the refresh circuitry 212 to perform the refresh operation. The refresh circuitry 212 may determine that the activated one or more memory rows 304a of the set of memory rows 304a are the selected memory rows 304a for the refresh operation. The refresh circuitry 212 then may perform the refresh operation on the selected one or more memory rows 304a and may skip the refresh operation for the memory rows 304a that have not been selected/not activated. The refresh operation includes reading the charge/data from the capacitors 302a of the memory cells 302 positioned on the selected one or more memory rows 304a and rewriting read data (for example: the data which can be accessed) into the capacitors 302a, by restoring the charge/data bits of the memory cells 302.

Once the refresh operation is completed on the selected one or more memory rows 304a, the refresh controller 208 issues the refresh skip command as an acknowledgment to the memory controller 214 indicating the completion of the refresh operation. Thus, the memory controller 214 does not wait or have to wait for the standard tRFC period for issuing the other commands to the memory device 202 for performing the other operations, which further lowers the bandwidth and/or time required for performing the refresh operation.

If the digital verification module 320 selects all of the activated set of memory rows 304a for the refresh operation, the refresh controller 208 then does not send the refresh skip command to the memory controller 214 of the host 204.

Figure 4B:
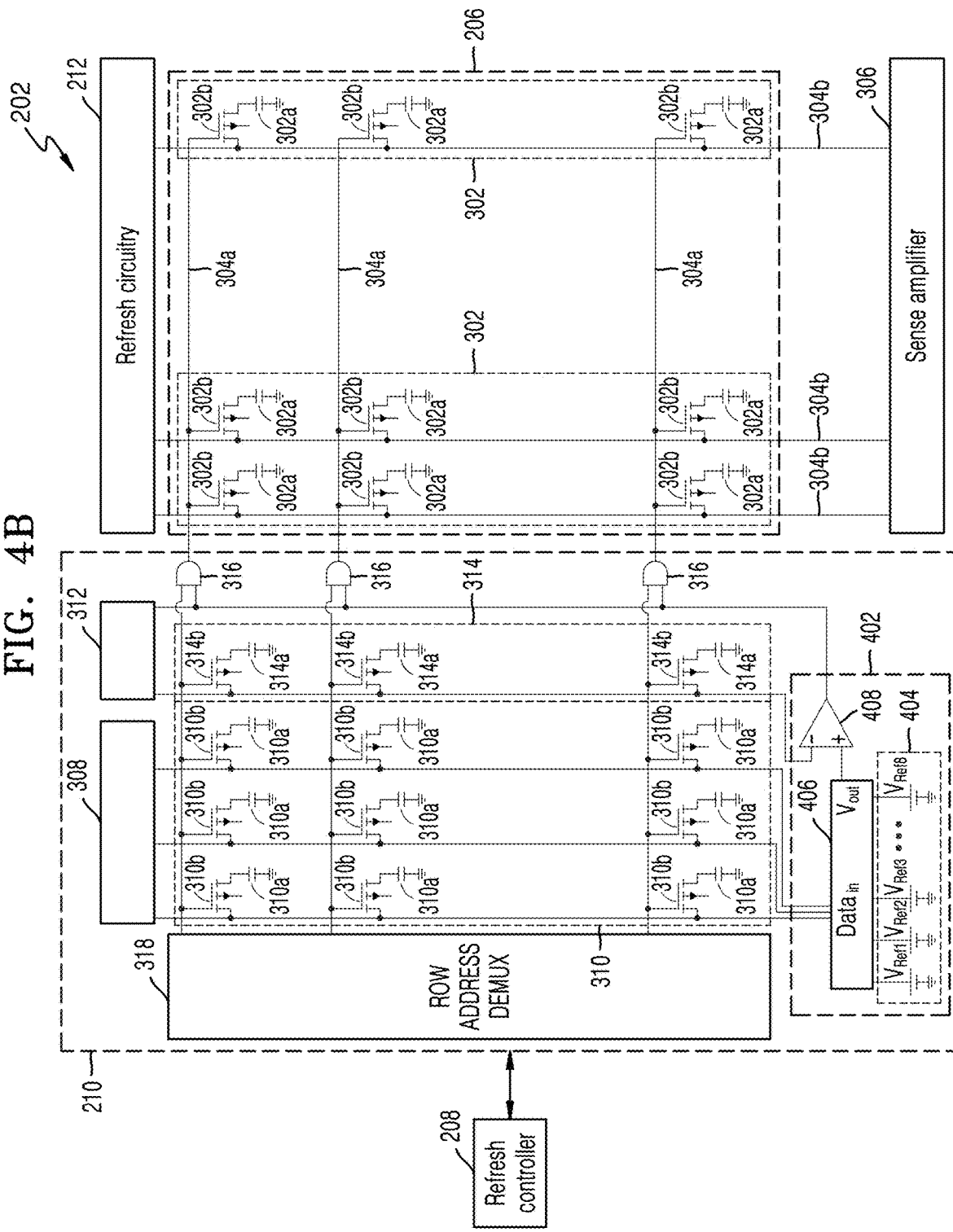

FIGS. 4a and 4b are block diagrams of the memory device 202 for controlling the refresh operation using stored voltage and supplemental cell voltage, according to some example embodiments as disclosed herein. In some example embodiments, the refresh-row selection circuitry 210 of the memory device 202 may include the single RCC/VCS cell 310 and the single supplemental cell 314 for the memory row 304a as depicted in FIG. 4A. In some example embodiments, the refresh-row selection circuitry 210 of the memory device 202 may include the one or more RCCs/VCS cells 310 and the single supplemental cell 314 for the single memory row 304a as depicted in FIG. 4B. In some example embodiments, the host 204 pre-initializes and/or stores the voltage of the RCCs 310 based on the cell retention criteria.

In some example embodiments, the refresh-row selection circuitry 210 can include an analog verification module 402, as depicted in FIGS. 4A and 4B. The analog verification module 402 may be configured to select the one or more memory row 304a for the refresh operation based on the voltage/charge stored in the capacitors 310a of the one or more RCCs 310 and the voltage/charge of the capacitors 314a of the one or more supplemental cells 314. The voltage/charge stored in the capacitors 310a of the one or more RCCs 310 may be referred hereinafter as a comparison voltage throughout. The voltage voltage/charge of the capacitors 314a of the one or more supplemental cells 314 may be referred hereinafter as the supplemental voltage throughout.

The analog verification module 402 includes a voltage generation circuitry 404, a plurality of transistors 406, and a comparator 408. The voltage generation circuitry 404 may be configured to generate and maintain reference voltages based on the number of the RCCs 310 that are connected to each memory row 304a. In some example embodiments, the voltage generation circuitry 404 can use an appropriate circuitry with variable, or alternatively pre-calculated, resistance values for generating and maintaining the reference voltages.

In some example embodiments, the voltage generation circuitry 404 can generate and maintain up to $2^N$ reference voltages, wherein 'N' depicts the number of RCCs 310 connected to each memory row 304a. For example, if the single RCC 310 is connected to the memory row 304a as depicted in FIG. 4A, the voltage generation circuitry 404 then maintains two reference voltages Vref1, and Vref2 (e.g. $2^1$ reference voltages). For example, if three RCCs 310 are connected to each memory row 304a as depicted in FIG. 4B, the voltage generation circuitry 404 maintains eight reference voltages Vref1-Vref8 (e.g. $2^3$ reference voltages). Further, if the plurality of RCCs 310 are connected to the single memory row 304a, then the RCCs 310 provides more granularity for the comparison of the voltages.

In some example embodiments, the RCCs 310 can be further divided into a number of groups for storing the comparison voltages. As depicted in FIG. 4A, the voltage stored in the one RCC 310 connected to the memory row 304a can be used for classification of the memory row 304a into the good row or the bad row. Thus, only two reference voltages can be/are maintained and one of the two reference voltages can be selected based on the voltage stored in the one RCC 310. For example, the voltage generation circuitry 404 can maintain the reference voltages of 1.15V, and 1V if the maximum voltage of the capacitor 310a of the RCC 310 is 1.2V. In such a case, if the voltage of the capacitor 310a of the RCC 310 is above 1.15V, then the memory row 304a connected to the RCC 310 may be considered as a "bad" row and may be selected for the refresh operation. If the voltage of the capacitor 310a of the RCC 310 is between 1.15V and 1V, then the memory row 304a connected to the RCC 310 may be considered as a "good" row and may be skipped from the refresh operation. Similarly, if the multiple RCCs 310 are connected to the memory row 304a, then the reference voltages can be maintained with more granularities. For example, the reference voltages of 1.15V, 1.1V, 1.05V, 1.0V, and so on can be maintained.

The transistors 406 can be connected to the voltage generation circuitry 404. The transistors 406 can be connected to the one or more RCCs 310 that is connected to the memory rows 304a using a diode 406a. The transistors 406 may be configured to select one of the $2^N$ reference voltages based on the initialized and/or stored voltages of the connected one or more RCCs 310. In some example embodiments, the transistors 406 with a simple selection mechanism may be used to select one of the $2^N$ reference voltages, if the single RCC 310 is connected to the memory row 304a. In some example embodiments, the transistors 406 combined with the complicated logic, such as DEMUX, or the like can be used to select one of the $2^N$ reference voltages, if the multiple RCCs 310 are connected to the memory row 304a.

The comparator 408 may be configured to logically compare the supplemental cell voltage of the supplemental cells 314 with the reference voltage selected by the transistors 406. The comparator 408 activates and/or inactivates the memory row 304a that is connected to the supplemental cell 314 based on the voltage comparison. For example, if the voltage of the supplemental cell 314 is less than the selected reference voltage, the comparator 408 then activates the memory row 304a that is connected to the corresponding supplemental cell 314, so that the activated row of memory cells 302 can be refreshed. If the voltage of the supplemental cell 314 is greater than or equal the selected reference voltage, the comparator 408 does not activate the memory row 304a that is connected to the corresponding supplemental cell 314, so that inactivated row can be skipped from the refresh operation.

For performing the refresh operation on the memory device 202, the memory controller 214 may issue the refresh command and the row addresses (corresponding to the set of memory rows 304a that have to be refreshed) to the memory device 202. At the memory device 202, the refresh controller 208 may receive the refresh command of the memory controller 214 through the relevant internal circuitry (not shown) of the memory device 202. The refresh controller 208 provides the received row addresses to the row address DEMUX 318. On receiving the row addresses, the row address DEMUX 318 activates the set of memory rows 304a that correspond to the received row addresses.

Upon activating the set of memory rows 304a, the at least one transistor 406 of the analog verification module 402 selects one of the $2^N$ reference voltages based on the initialized and/or stored comparison voltage of the one or more RCCs 310 that is connected to the identified set of memory rows 304a. The transistor 406 provides the selected reference voltage to the comparator 408. The comparator 408 may also receive the supplemental voltage of the supplemental cells 314 that are connected to the activated set of memory rows 304a. The comparator 408 then compares the supplemental voltage of the supplemental cells 314 with the selected reference voltage. If the supplemental voltage of the supplemental cells 314 is less than the selected reference voltage, then the comparator 408 selects the one or more memory rows 304a that are connected to the corresponding supplemental cells 314 for the refresh operation. The comparator 408 allows the selected one or more memory rows 304a to be active. If the supplemental voltage of the supplemental cells 314 is greater than or equal to the selected reference voltage, then the comparator 408 does not select the one or more memory rows 304a that are connected to the corresponding supplemental cells 314 for the refresh operation. The comparator 408 further enables the row address DEMUX 318 to deactivate the one or more memory rows 304a that have not selected for the refresh operation, by blocking the signal 1 on the corresponding one or more rows. The comparator 408 further enables the row address DEMUX 318 to activate the selected one or more memory rows 304a for the refresh operation, if the selected one or more memory rows 304a are not active.

Upon selecting the one or more memory rows 304a for the refresh operation, the refresh controller 208 enables the refresh circuitry 212 to perform the refresh operation. The refresh circuitry 212 performs the refresh operation on the activated/selected one or more memory rows 304*a* and skips the refresh operation for the memory rows 304*a* that have not been selected/not activated. The refresh operation includes reading the charge/data from the capacitors 302*a* of the memory cells 302 positioned on the selected one or more memory rows 304*a* and rewriting read data (for example: the data which can be accessed) into the capacitors 302*a* by restoring the charge/data bits of the memory cells 302.

Once the refresh operation on the selected one or more memory rows 304*a* has been completed, the refresh controller 208 issues the refresh skip command as the acknowledgment to the memory controller 214 indicating the completion of the refresh operation. Thus, the memory controller 214 does not wait/have to wait for the standard tRFC period for issuing the other commands to the memory device 202 for performing the other operations, which further lowers the bandwidth and time required for performing the refresh operation.

If the comparator 408 allows all the identified set of rows of the memory cells 302 to be active for the refresh operation, the refresh controller 208 does not send the refresh skip command to the memory controller 214 of the host 204.

In some example embodiments, the refresh controller 208 maintains a refresh counter (not shown), which can be configured to track a count of the memory rows 304*a* that have been refreshed in each refresh cycle. In an embodiment, the refresh controller 208 can increment the count of the refresh counter on the completion of the refresh operation on each selected memory row 304*a*. In an embodiment, the refresh controller 208 can also increment the count of the refresh counter on skipping the refresh operation for each row. In an embodiment, the refresh controller 208 can also increment the count of the refresh counter in parallel with issuing the refresh skip command to the host 204.

FIGS. 3*a*, 3*b*, 4*a*, and 4*b* show exemplary blocks of the memory device 202, but it is to be understood that other embodiments are not limited thereon. In other embodiments, the memory device 202 may include a less or more number of blocks. Further, the labels or names of the blocks are used only for illustrative purpose and does not limit the scope of the embodiments herein. One or more blocks can be combined together to perform same or substantially similar function in the memory device 202.

Figure 5:
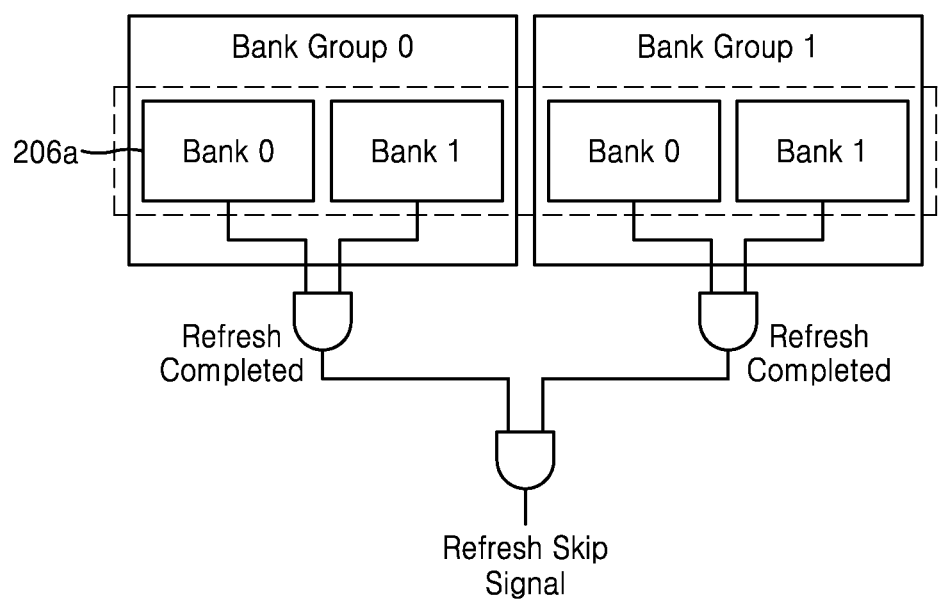
FIG. 5 is an example diagram depicting refreshing of one or more memory banks of at least one memory array, according to some example embodiments as disclosed herein.

FIG. 5 is an example diagram depicting refreshing of one or more memory banks of the at least one memory array 206, according to some example embodiments as disclosed herein. As depicted in FIG. 5, the memory array 206 includes a plurality of memory banks 206*a*, wherein each memory bank 206*a* may comprise of the memory cells 302 positioned on the memory rows/word lines and the bit lines. The memory banks 206*a* may be grouped into a plurality of groups (herein after referred as bank groups). For example as depicted in FIG. 5, each of the bank groups (a bank group 0, a bank group 1, and so on) may include the two memory banks 206*a* (a memory bank 0, and a memory bank 1).

In some example embodiments, the refresh controller 208 of the memory device 202 may receive the refresh command from the host 204 for refreshing the set of memory banks 206*a*. In such a case, the refresh controller 208 selectively refreshes the memory rows 304*a* within each memory bank 206*a* of the set of memory banks 206*a* using the associated supplementary cell reload circuitry 312, and the row condition circuitry 310. In some example embodiments, the refresh controller 208 monitors the completion of the refresh operation within each memory bank 206*a* and sends the refresh skip command to the host 204 on completion of the refresh operation within all the set of memory banks 206*a*, which have indicated by the host 204 for the refresh operation. The refresh skip command may indicate the completion of the refresh operation on the indicated set of memory banks 206*a* to the host 204.

Figure 6A:
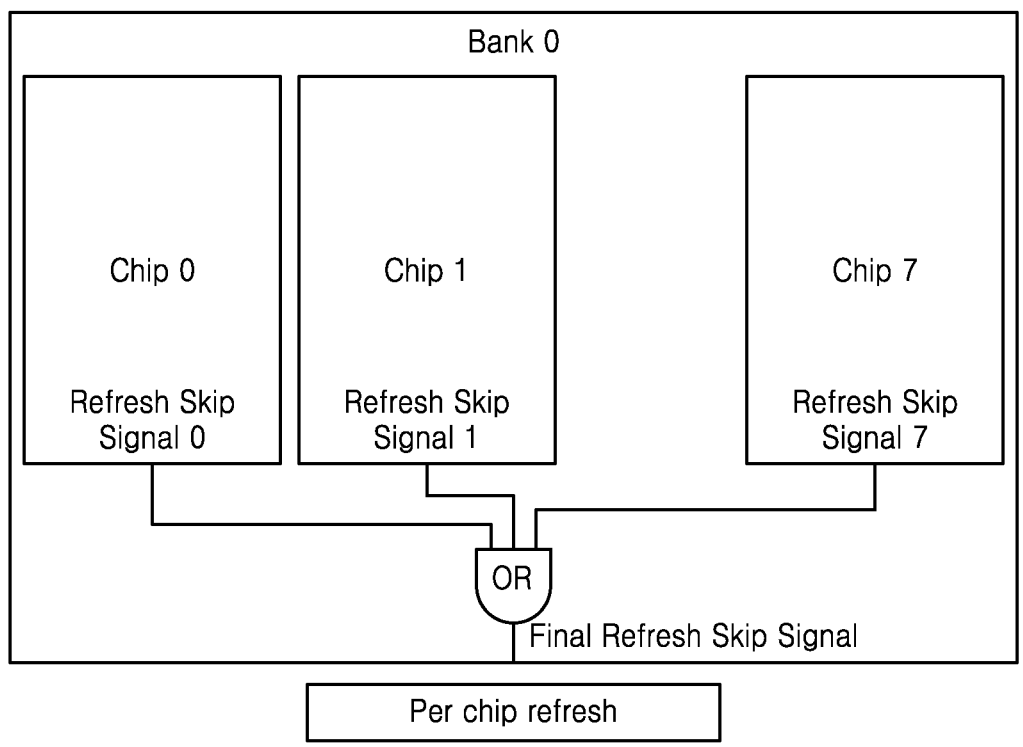
FIGS. 6A and 6B are example diagrams depicting refresh operations of the one or more memory chips coupled to the host, according to some example embodiments as disclosed herein.
Figure 6B:
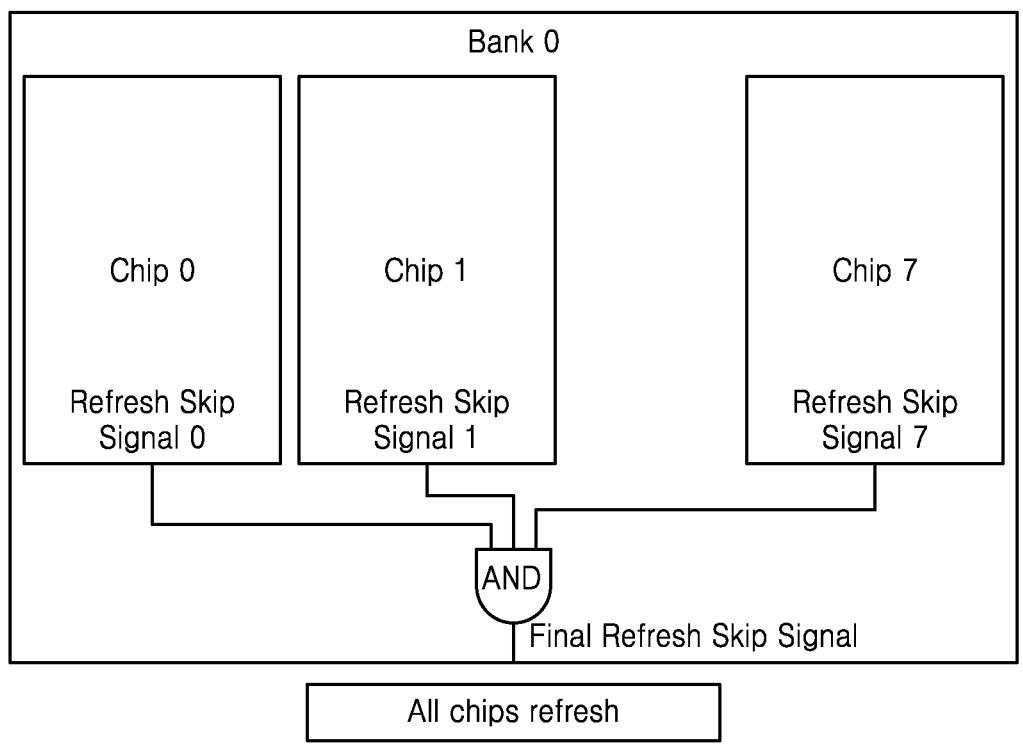

FIGS. 6*a* and 6*b* are example diagrams depicting refresh operations of the one or more memory chips 206 coupled to the host 204, according to some example embodiments as disclosed herein. In some example embodiments, the memory device 202 may include a plurality of memory chips 206 for storing the data. In some example embodiments, as depicted in FIGS. 6*a*, and 6*b*, the memory device 202 may include seven memory chips 206. The memory chips 206 can be further connected to their associated refresh controllers 208.

In some example embodiments, the refresh controller(s) 208 can receive the refresh command from the host 204 for refreshing the set of memory chips 206. In such a case, the refresh controller 208 selectively refreshes the memory rows 304*a* within each memory chip 206 of the set of memory chips 206 using the associated supplementary reload circuitry 312, and the row condition circuitry 310. In an embodiment, the refresh controller 208 may send the refresh skip command to the host 204 on completion of the refresh operation within each memory chip 206 of the set of memory chips 206, as depicted in FIG. 6A. The refresh skip command may indicate the completion of the refresh operation on the particular memory chip 206 to the host 204.

In some example embodiments, the refresh controller 208 monitors the completion of the refresh operation within each memory chip 206, and sends the refresh skip command to the host 204 on completion of the refresh operation within all the set of memory chips 206, which have been indicated by the host 204 for the refresh operation as depicted in FIG. 6B. The refresh skip command may indicate the completion of the refresh operation on the indicated set of memory chips 206 to the host 204.

Example embodiments herein further enable the refresh controller 208 to include multiple refresh coordination mechanisms for coordinating different kinds of refresh operations that may be performed on the memory device 202. The different kinds of refresh operations can be, but not are limited to, the refresh operations performed on the memory banks (206*a*) of the memory device 202, the refresh operations performed on the memory bank groups, the refresh operations performed on the memory chips 206 of the memory device 202, and/or the refresh operations performed on any other component of the memory device 202. In some example embodiments, the refresh coordination mechanisms may involve tracking the refresh operations being performed in each memory bank 206*a*, the memory chip 202 and/or the like, receiving a signal from each memory bank 206*a* or memory chip 206 or the like on completion of the refresh operation in it, and coordinating the refresh operations on receiving the signals from all the memory banks 206*a*, or the memory chips 206, and/or the like. The refresh controller 208 can coordinate the refresh operations using a logic AND gate function. For example, the refresh controller 208 can coordinate the refresh operations by performing the AND gate operation on the signals received from the memory banks 206*a*, or the memory chips 206, or the like.

Figure 7:
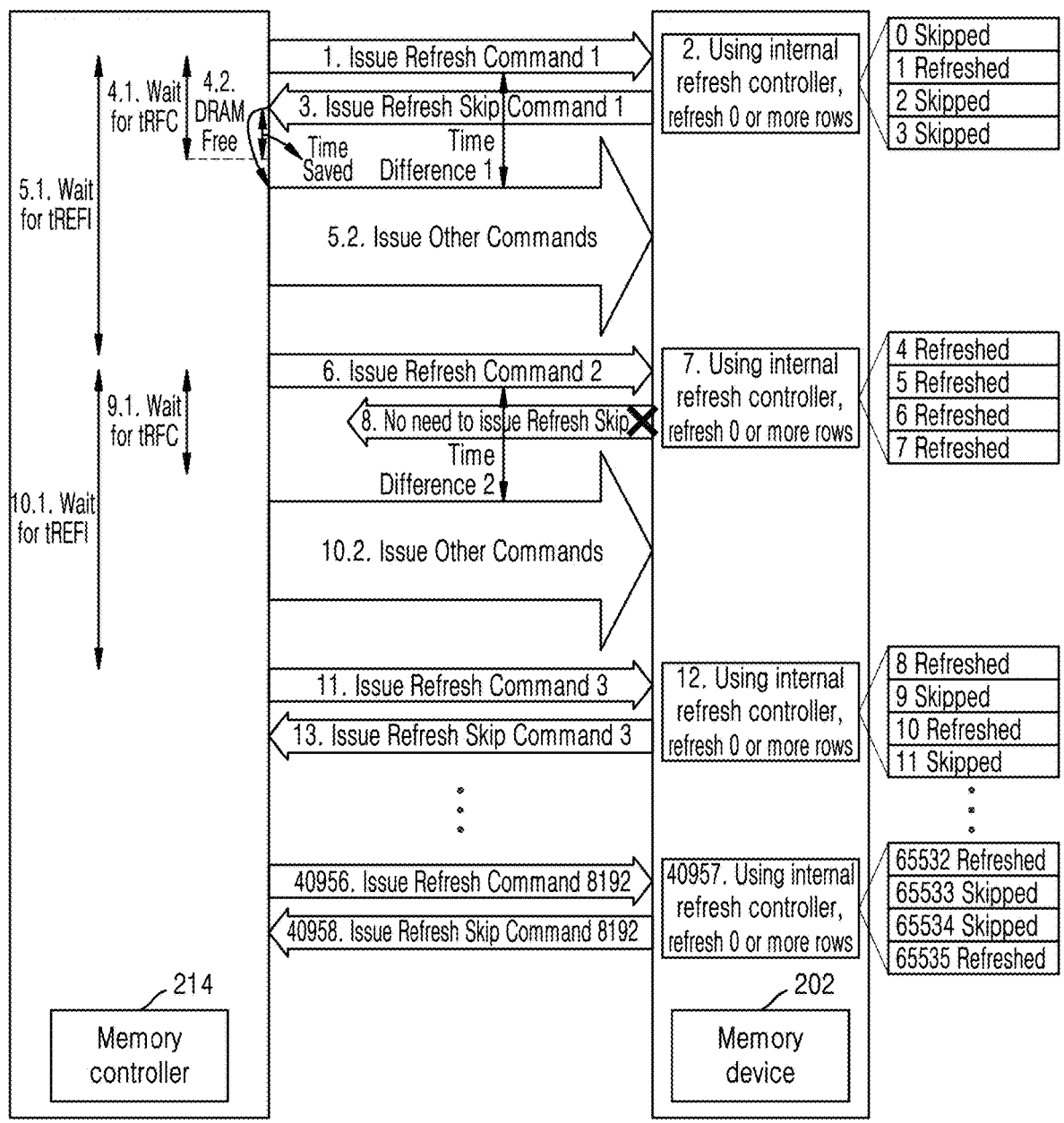
FIG. 7 is an example flow diagram depicting a method for controlling the refresh operation of the at least one memory device, according to some example embodiments as disclosed herein.

FIG. 7 is an example flow diagram depicting a method for controlling the refresh operation of the at least one memory device 202, according to some example embodiments as disclosed herein. At step 1, the memory controller 214 of the host 204 issues the refresh command (for example; a first refresh command) to the refresh controller 208 of the memory device 202 to perform the refresh operation on the set of memory rows 304a in the at least one memory array 206. In an example herein, consider that the memory controller 214 issues the refresh command to perform the refresh operation on four memory rows 304a (for example; a row 0, a row 1, a row 2, and a row 2).

At step 2, the refresh controller 208 determines the one or more memory rows 304a selected from the memory rows 0-4 for the refresh operation by the refresh-row selection circuitry 210, and executes/performs the refresh operation on the selected one or more memory rows 304a. In some example embodiments, the refresh-row selection circuitry 210 selects the one or more memory rows 304a for the refresh operation by tracking the conditions of the memory cells 302 included in the set of memory rows 304a (e.g. based on the RCCs 310 connected to the set of memory rows 304a) and determining the refresh requirements by checking if the set of memory rows have refreshed in the previous refresh cycle (e.g. based on the supplemental cells 314 connected to the set of memory rows 304a).

In some example embodiments, the refresh-row selection circuitry 210 selects the one or more memory rows 304a for the refresh operation based on the supplemental voltage of the supplemental cells 314 connected to each of the set of memory rows 304a and the comparison voltage stored in the RCCs 310 connected to each of the set of memory rows 304a. In some example embodiments, consider that the refresh-row selection circuitry 210 selects the row 1 for the refresh operation. In such a case, the refresh controller 208 performs the refresh operation on the row 1 and skips the refresh operation for the other three memory rows (the row 0, the row 2, and the row 3).

At step 3, the refresh controller 208 issues the refresh skip command to the memory controller 214 on the completion of the refresh operation on the row 1 of the memory cells 302.

At step 4.2, upon receiving the refresh skip command from the refresh controller 208, the memory controller 214 determines that the memory device 202 is free. In addition, the refresh skip command may be used as multiple refresh commands and may be executed together if the refresh operation is to be performed in advance (i.e. in case of refresh preponing) or if the refresh operation is to be postponed. At step 5.1, the memory controller 214 waits for the tREFI by tracking the time of issuance of the first refresh command for issuing another refresh command.

At step 5.2, the memory controller 214 issues the other commands (for example, the read commands, the write commands, and/or the like) to the relevant internal circuitry (not shown) of the memory device 202 for performing the other operations (for example; the read operations, the write operations, and/or the like) on determining that the memory device 202 is free. Thus, the memory controller 214 can issue the other commands to the memory device 202 without waiting for the tRFC period (at step 4.1), which further reduces the bandwidth and time required for performing the refresh operation. The tRFC can be the time defined for the completion of the refresh operation on the indicated set of memory rows (for example: four rows).

At step 6, the memory controller 214 issues another refresh command (for example: a second refresh command) for refreshing another set of memory rows 304a (for example; rows 4-rows 7), once the tREFI has passed.

At step 7, the refresh controller 208 determines the one or more memory rows 304a selected from the rows 4-7 for the refresh operation by the refresh-row selection circuitry 210 and performs the refresh operation on the selected one or more memory rows 304a. In an example herein, consider that the refresh-row selection circuitry 210 selects all the rows (i.e. the rows 4-7) for the refresh operation. In such a case, the refresh controller 208 performs the refresh operation on all the rows 4-7 without issuing the refresh skip command to the memory controller 214 (at step 8).

At step 9.1, the memory controller 214 waits for the tRFC defined for the completion of the refresh operation on the rows 4-12, since the memory controller 214 has not received the refresh skip command from the refresh controller 208.

At step 10.1, once the tRFC has passed, the memory controller 214 determines the completion of the refresh operation and waits for the tREFI by tracking time of issuance of the second refresh command. At step 10.2, the memory controller 214 issues the other commands to the relevant internal circuitry (not shown) of the memory device 202 for performing the other operations, once the tRFC has passed.

At step 11, the memory controller 214 issues another refresh command (for example: a third refresh command) to the memory device 202 for refreshing another set of memory rows 304a (for example; rows 8-rows 11), once the tREFI has passed.

At step 12, the refresh controller 208 determines the one or more memory rows selected from the rows 8-11 for the refresh operation by the refresh-row selection circuitry 210 and performs the refresh operation on the selected one or more memory rows. In some example embodiments, consider that the refresh-row selection circuitry 210 selects the row 8, and the row 10 for the refresh operation. In such a case, the refresh controller 208 performs the refresh operation only on the row 8, and the row 1, and skips the refresh operation for the row 9, and the row 10. At step 13, the refresh controller 208 issues the skip command to the memory controller 214 on the completion of the refresh operation on the row 8, and the row 10. Further, the memory controller 214 may continue issuing refresh commands to the refresh controller 208 for refreshing the set of memory rows 304a by tracking the tREFI until the completion of the refresh operation on all the memory rows 304a in the at least one memory array 206.

Figure 8:
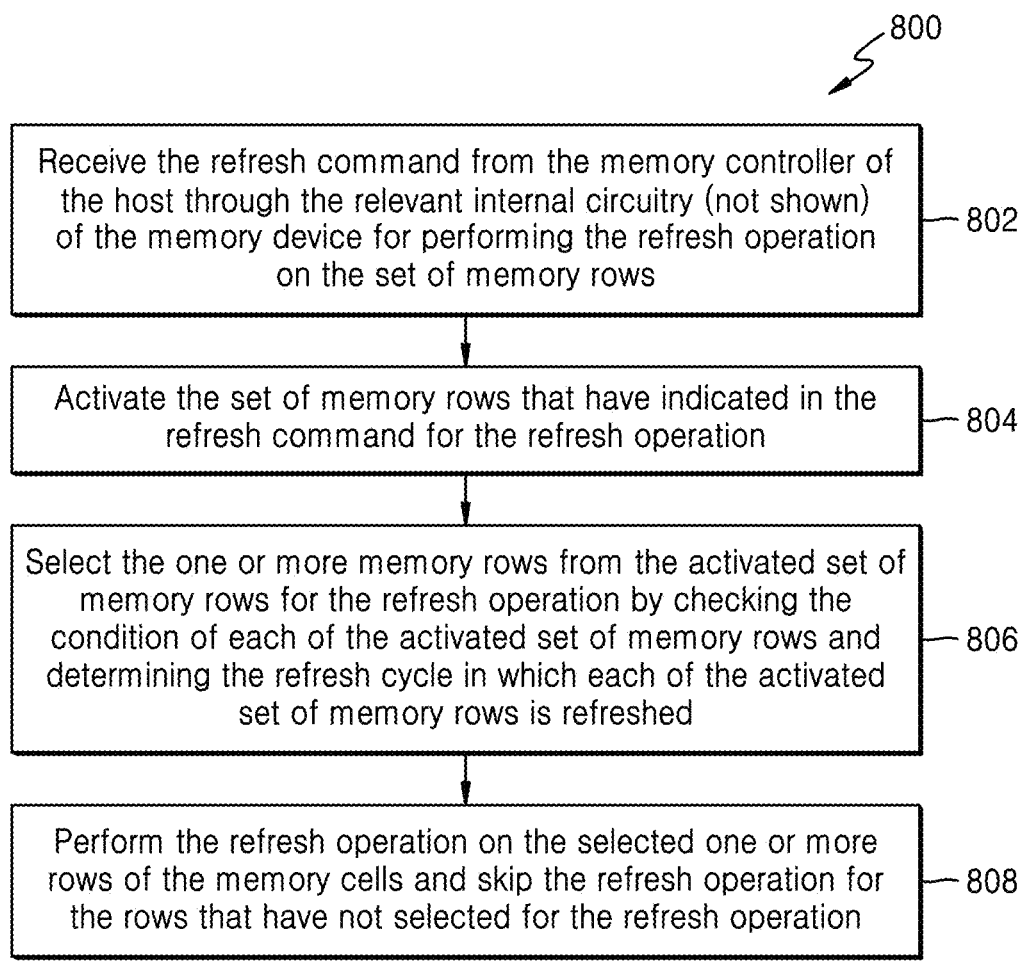
FIG. 8 is an example flow diagram depicting a method for controlling the refresh operation in the memory device using the data bits of the RCCs, and the supplemental cells, according to some example embodiments as disclosed herein.

FIG. 8 is an example flow diagram 800 depicting a method for controlling the refresh operation in the memory device 202 by performing the digital reading of the data bits of the RCCs 310, and the supplemental cells 314, according to some example embodiments as disclosed herein. At step 802, at the memory device 202, the refresh controller 208 receives the refresh command from the memory controller 214 of the host 204 through the relevant internal circuitry (not shown) of the memory device 202 for performing the refresh operation on the set of memory rows 304a. At step 804, the refresh controller 208 enables the row address DEMUX 318 to activate the set of memory rows 304a that is indicated in the refresh command for the refresh operation.

At step 806, the refresh controller 208 enables the digital verification module 320 to select the one or more memory rows 304a from the activated set of memory rows 304a for the refresh operation. For selecting the one or more memory rows 304a, the digital verification module 320 determines the conditions of each activated memory row 304a by reading the data bit(s) of the RCC(s) 310 connected to each memory row 304a. The digital verification module 320 further determines the refresh requirements of each identified memory row 304a by reading the data bit(s) of the supplemental cells 314 connected to each memory row 304a. Based on the determined conditions, and the refresh requirements, the digital verification module 320 selects the one or more memory rows for the refresh operation. The digital verification module 320 further enables the selected one or more memory rows 304a to be active. The digital verification module 320 enables the row address DEMUX 318 to deactivate the one or more memory rows 304a that are not selected for the refresh operation.

At step 808, the refresh controller 208 enables the refresh circuitry 212 to perform the refresh operation on the selected one or more rows of the memory cells 302 and to skip the refresh operation for the rows that have not selected for the refresh operation. The refresh circuitry 212 determines the one or more memory rows 304a that have been selected/not selected for the refresh operation based on their activation, and accordingly performs the refresh operations or skips the refresh operation. The various actions in method 800 may be performed in the order presented, in a different order or simultaneously. Further, in some example embodiments, some actions listed in FIG. 8 may be omitted.

Figure 9:
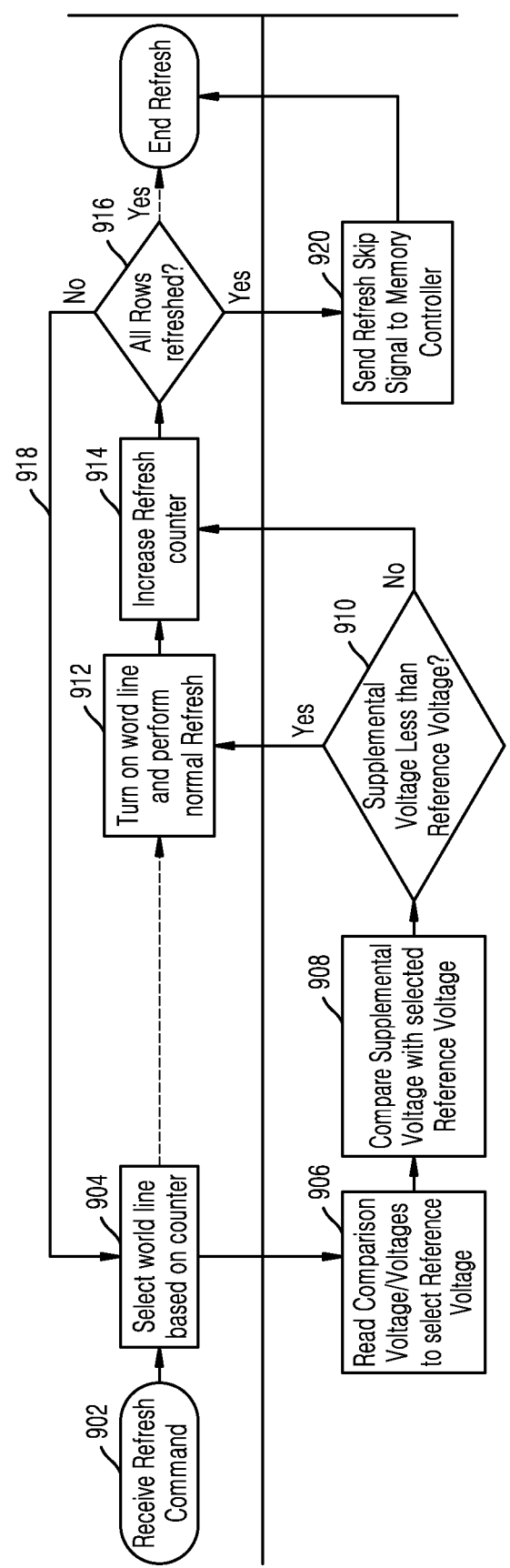
FIG. 9 is an example flow diagram depicting a method for controlling the refresh operation in the memory device using the voltage of the supplemental cells and the RCCs, according to some example embodiments as disclosed herein.

FIG. 9 is an example flow diagram depicting a method for controlling the refresh operation in the memory device 202 by performing the analog reading of the voltages of the supplemental cells 314 and the RCCs 310, according to some example embodiments as disclosed herein. At step 902, at the memory device 202, the refresh controller 208 receives the refresh command from the memory controller 214 of the host 204 through the relevant internal circuitry (not shown) of the memory device 202 for performing the refresh operation on the set of memory rows 304a. At step 904, the refresh controller 208 enables the row address DEMUX 318 to activate the set of memory rows 304a that have been indicated in the refresh command for the refresh operation.

At step 906, the refresh controller 208 enables the analog verification module 402 to select one or more memory rows 304a from the activated set of memory rows 304a for the refresh operation. For selecting the one or more memory rows 304a, the refresh controller 208 determines the initialized/stored comparison voltage of the RCC(s) 310 connected to each of the activated set of memory rows 304a and selects one of the reference/comparison voltages. At step 908, the analog verification module 402 compares the supplemental voltage of the supplemental cell(s) 314 connected to each of the activated set of memory rows 304a with the selected reference voltage. At step 910, the analog verification module 402 checks if the voltage of the supplemental cell(s) connected to each of the set of memory rows 304a is less than the selected reference/comparison voltage.

At step 912, the analog verification module 402 activates the one or more memory rows 304a of the set of memory rows 304a, if the voltage of the supplemental cell(s) 314 connected to the one or more memory rows 304a is less than the selected reference/comparison voltage. The refresh controller 208 may enable the refresh circuitry 212 to perform the refresh operation on the activated one or more memory rows 304a. The refresh controller 208 enables the refresh circuitry 212 to skip the refresh operation on the inactive one or more memory rows 304a.

At step 914, the refresh controller 208 increments the refresh counter on performing the refresh operation and/or skipping the refresh operation. The refresh counter can be used for tracking the refresh operation performed/skipped on the number of memory rows 304a. At step 916, the refresh controller 208, checks if the refresh operation has been performed/skipped on all the activated set of memory rows 304a.

At step 918, if the refresh operation has not been performed/skipped on all the set of memory rows 304a (that have indicated in the refresh command to be refreshed), then the steps 904-918 may be repeated. At step 920, if the refresh operation is performed/skipped on all the set of rows of the memory cells 302, the refresh controller 208 issues the refresh skip command as the acknowledgement for completion of the refresh operation to the memory controller 214 of the host 204.

Figure 10:
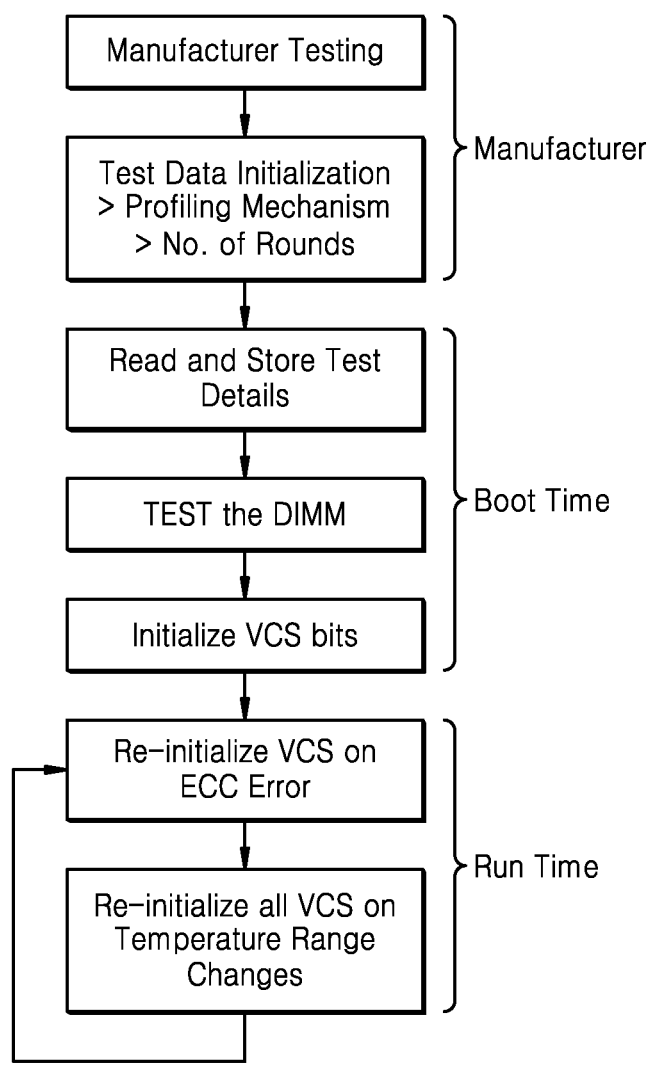
FIG. 10 is an example diagram depicting initialization of the data bits/voltage of the RCC(s) that is connected to each memory row, according to some example embodiments as disclosed herein

FIG. 10 is an example diagram depicting initialization of the data bits/voltage of the RCC(s) 310 that are connected to each memory row 304a, according to some example embodiments as disclosed herein. Example embodiments herein enable the host 304 to pre-initialize and/or store data bits/voltage of the one or more RCC(s) 310 that is connected to each memory row 304a using the cell retention criteria. The retention criteria can be maintained/provided in the memory device 202 during the manufacturing of the memory device 202. The retention criteria may include information such as, but not limited to, the retention profiling mechanism suited to identify the weak memory cells 302, the number of rounds of testing required to identify the weak memory cells 302, the retention time test to determine if each memory row 304a can be refreshed at a normal rate, and so on. Once the memory device 202 initializes/boots up, the BIOS of the host 204 (not shown) accesses the retention criteria maintained in the memory device 202. Thereafter, the host 204 performs the testing on the memory device 202 using the accessed retention criteria. In an example embodiment, the CPGC module, and the MBIST module can be used to increase the speed of testing of the memory device 202. During the testing, the host initializes the RCC(s) 310 connected to each memory row 304a on determining whether the memory cells 302 included in the rows have passed the accessed cell retention criteria or not.

In an example embodiment, the host 204/digital verification module 320 can re-initialize the RCC(s) 310 on the occurrence of the ECC errors. In an embodiment, the host 204 can re-initialize the RCC(s) 310 by performing the scrub method at regular intervals or once the memory device 202 crosses the certain temperature threshold.

Figure 11:
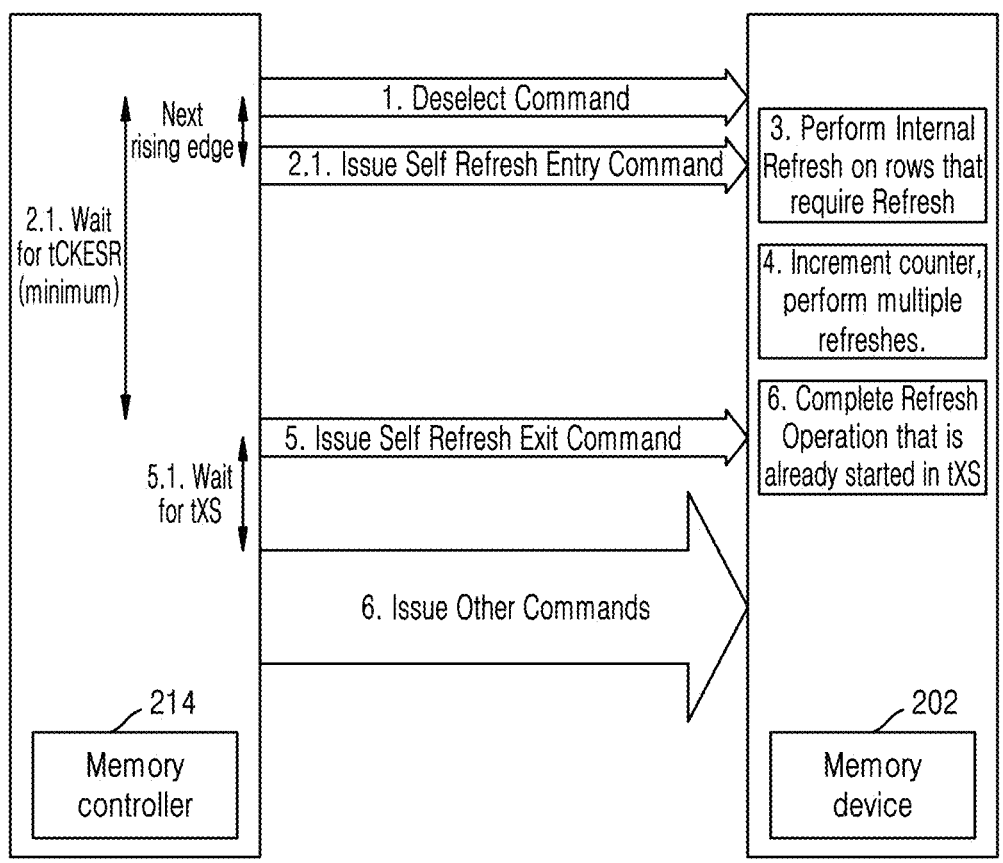
FIG. 11 is an example sequence diagram depicting a method for performing the self-refresh operation, according to some example embodiments as disclosed herein.

FIG. 11 is an example sequence diagram depicting a method for performing the self-refresh operation, according to some example embodiments as disclosed herein. Embodiments herein enable the memory controller 214 of the host 204 to issue self-refresh commands to the memory device 202 for performing the refresh operation, when the memory device 202 in a self-refresh mode. The self-refresh mode is a low power mode in which the memory device 202 maintains the refreshing of the memory rows 304a internally. In an example embodiment, in the self-refresh mode, the refresh controller 208 receives a self-refresh entry command from the memory controller 214 of the host 204 and recursively performs at least one action internally until a reception of a self-refresh exit command from the memory controller 214. The at least one action involves performing the refresh operations on the selected memory rows 304a by keep on incrementing the counter and begins the refresh operation again on the selected memory rows 304a once the refresh operations on the selected memory rows 304a are completed.

At step 1, the memory controller 214 of the host 204 issues the deselect command to the memory device 202 when the memory device 202 is in the self-refresh mode to disable all the input signals except clock and RESET_n signals. The deselect command can be used for initiating the self-refresh operation in the memory device 202.

At step 2.1, the memory controller 214 issues the self-refresh entry command to the refresh controller 208 of the memory device 202 on a rising edge of the clock CKE. At step 2.2, the memory controller 214 waits for tCKESR. The tCKESR can be an amount of cycles that the CKE has to be low for the "self-refresh entry to self-refresh exit". At step 3, the refresh controller 208 performs the refresh operation on the one or more memory rows 304a that have selected for the refresh operation internally. At step 4, the refresh controller 208 increments the refresh counter and performs the multiple refresh operations internally.

At step 5, the memory controller 214 issues the self-refresh exit command to the refresh controller 208 to stop performing the refresh operation. At step 5.1, the memory controller 214 waits for tXS for issuing self-refresh exit DESELECT commands to the refresh controller 208. At step 6, the refresh controller 208 completes the refresh operation that is already initiated in the tXS. The memory device 202 exits from the self-refresh mode on receiving the self-refresh exit DESELCT commands from the memory controller 214. When the memory device 202 exists from the self-refresh mode, a Vref DQ generator circuitry (in-built circuitry of the memory device 202) can be powered up, and stable within the tXS period.

At step 7, the memory controller 214 issues the other commands to the memory device 202 to perform the other operations (for example; the read, and write operations).

Figure 12:
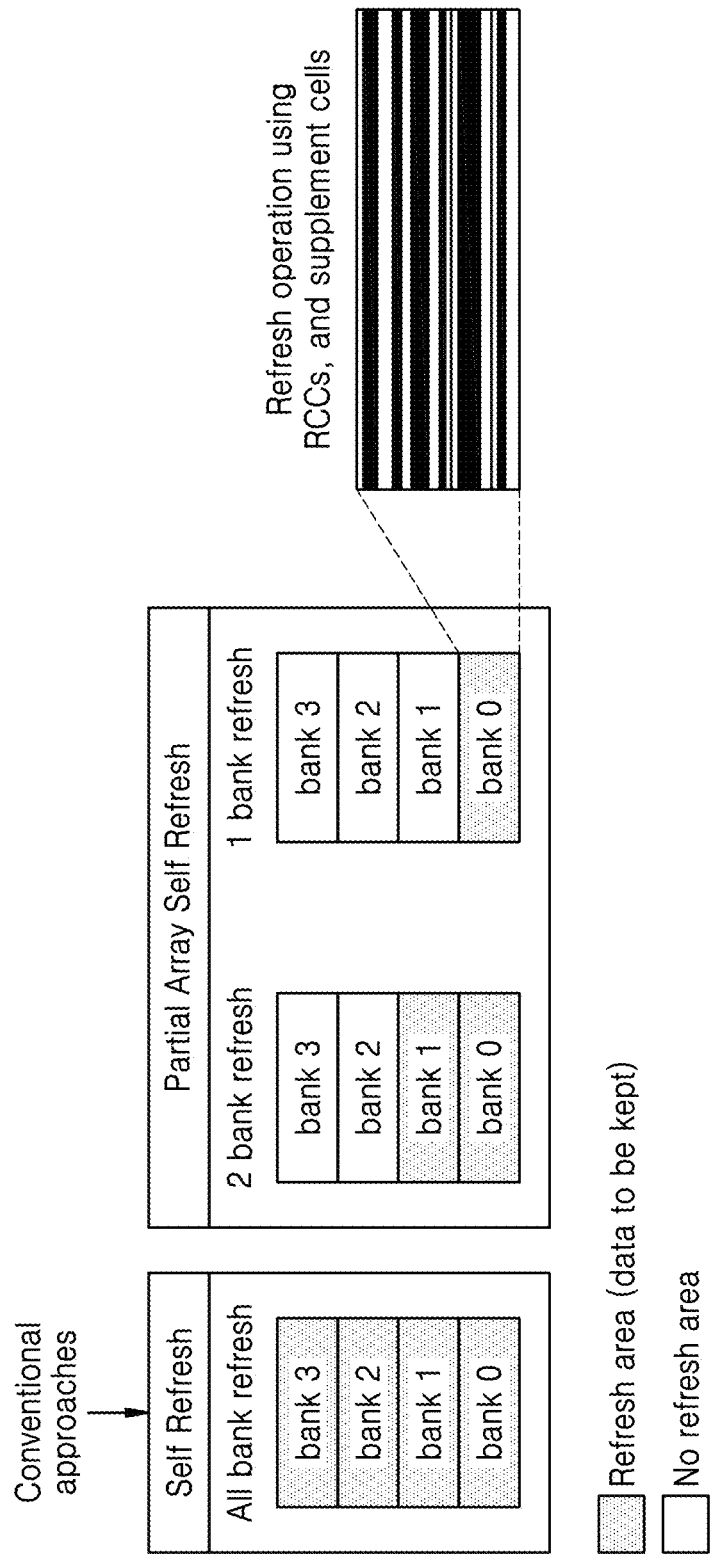
FIG. 12 is an example diagram depicting conventional refresh operations, and the refresh operations performed using the RCCs and the supplemental cells, according to some example embodiments as disclosed herein.

FIG. 12 is an example diagram depicting conventional refresh operations, and the refresh operations performed using the RCCs 310 and the supplemental cells 314, according to some example embodiments as disclosed herein. In an example embodiment, conventional self-refresh operations, and partial array self-refresh operations are depicted in FIG. 12. However, granularity of refresh cannot be ensured in such refresh operations. In contrast, embodiments herein use the RCCs 310 and the supplemental cells 314 to perform the granularity of refresh operations. A level of granularity of the row operations may be row wise. However, the memory rows 304a can also be further divided into different levels. In an embodiment, the memory row 304a can be internally divided into for example: 4, 8 or 16 rows, as large row sizes induce parasitic capacitance, which may not be good for reading or writing the data, which can further adds the more granularity. Embodiments herein also enable the RCCs 310 to determine the refresh operation requirements.

Embodiments herein further allocate/restore the data to the memory device 202 without requiring any optimizations and calculations.

Embodiments herein control a refresh operation of a memory device by integrating one or more row condition cells (RCCs) and one or more supplemental cells to each memory row in the memory device.

Embodiments herein select one or more memory rows for the refresh operation by performing at least one of a digital reading and an analog reading of the one or more RCCs and one or more supplemental cells and perform at least one refresh operation on the selected one or more memory rows. Performing the refresh operation using the one or more RCCs and supplemental cells lowers power consumption, bandwidth, and time required for the refresh operation, which further enhances performance of the memory device.

Embodiments herein allow temperature dependent power enhancement for the refresh operation using the one or more supplemental cells.

The embodiments disclosed herein can be implemented through at least one software program running on at least one hardware device and performing network management functions to control the elements. The elements shown in FIGS. 2-6b can be at least one of a hardware device, or a combination of hardware device and software module.

The embodiments disclosed herein describe methods and systems for controlling a refresh operation of a memory device. Therefore, it is understood that the scope of the protection is extended to such a program and in addition to a computer readable means having a message therein, such computer readable storage means contain program code means for implementation of one or more steps of the method, when the program runs on a server or mobile device or any suitable programmable device. The method is implemented in a preferred embodiment through or together with a software program written in e.g. Very high speed integrated circuit Hardware Description Language (VHDL) another programming language, or implemented by one or more VHDL or several software modules being executed on at least one hardware device. The hardware device can be any kind of portable device that can be programmed. The device may also include means which could be e.g. hardware means like e.g. an ASIC, or a combination of hardware and software means, e.g. an ASIC and an FPGA, or at least one microprocessor and at least one memory with software modules located therein. The method embodiments described herein could be implemented partly in hardware and partly in software. Alternatively, the invention may be implemented on different hardware devices, e.g. using a plurality of CPUs.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of embodiments, those of ordinary skill in the art will recognize that the embodiments herein can be practiced with modification within the spirit and scope of the embodiments as described herein.

What is claimed is:

1. A method for controlling a refresh operation of a memory device, the method comprising:
   receiving, by a refresh controller from a host, at least one refresh command for a plurality of memory rows in the memory device, wherein each of the plurality of memory rows include a plurality of memory cells;
   selecting, by a refresh-row selection circuitry, at least one memory row from the plurality of memory rows by reading at least one row condition cell (RCC) and at least one supplemental cell, each of the at least one RCC and the at least one supplemental cell being associated with respective memory rows of the plurality of memory rows; and
   performing, by the refresh controller, the refresh operation on the selected at least one memory row using a refresh circuitry.

2. A method for controlling a refresh operation of a memory device, the method comprising:

receiving, by a refresh controller, from a host, at least one refresh command for a plurality of memory rows in the memory device, wherein a plurality of memory cells are on each memory row;

selecting, by a refresh-row selection circuitry, at least one memory row from the plurality of memory rows based on at least one condition and refresh rules of the plurality of memory cells, the at least one condition and the refresh rules determined by reading at least one row condition cell (RCC) and at least one supplemental cell, each RCC and each supplemental cell being associated with a memory row of the plurality of memory rows;

performing, by the refresh controller, the refresh operation on the selected at least one memory row using a refresh circuitry;

skipping, by the refresh controller, the refresh operation on the at least one memory row of the plurality of memory rows that is not selected; and issuing, by the refresh controller, a refresh skip indication to the host upon completion of the refresh operation on the selected at least one memory row.

3. A memory device comprising:

at least one memory array including a plurality of memory cells, wherein the plurality of memory cells are arranged on each memory row of a plurality of memory rows;

a refresh-row selection circuitry including at least one row condition cell (RCC) connected to a memory row of the plurality of memory rows and at least one supplemental cell connected to the memory row of the plurality of memory rows; and a refresh controller coupled to the refresh-row selection circuitry, the refresh controller configured to,
receive at least one refresh command from a host for the plurality of memory rows in the memory device,
enable the refresh-row selection circuitry for selecting at least one memory row of the plurality of memory rows by reading the at least one RCC and the at least one supplemental cell that are associated with the memory row of the plurality of memory rows, and
perform the refresh operation on the selected at least one memory row using a refresh circuitry.

4. The memory device of claim 3, wherein the memory device includes a volatile semiconductor memory device.

5. The memory device of claim 3, wherein the at least one RCC is at least one of a volatile memory cell or a non-volatile memory cell, and the at least one supplemental cell is a volatile memory cell.

6. The memory device of claim 3, wherein the refresh-row selection circuitry comprises at least one of:
a digital verification module configured to perform a digital reading of the at least one RCC and the at least one supplemental cell; or
an analog verification module configured to perform an analog reading of the at least one RCC and the at least one supplemental cell connected to each memory row of the plurality of memory rows.

7. The memory device of claim 6, wherein the digital verification module is further configured to:
read at least one data bit of the at least one RCC to classify each memory row into at least one condition, the at least one condition including at least one good condition and at least one bad condition, the at least one bad condition indicating the memory row has poor refresh performance compared with the at least one good condition;
read at least one data bit of the at least one supplemental cell to determine if the refresh operation is performed on each memory row in at least one previous refresh cycle; and
select the at least one memory row from the plurality of memory rows for the refresh operation if the at least one memory row is classified into at least one bad condition, and if the refresh operation is not performed on the at least one memory row in the at least one previous refresh cycle.

8. The memory device of claim 7, wherein the host coupled to the memory device is configured to initialize the at least one data bit of the at least one RCC by:
accessing cell retention criteria maintained in the memory device during booting of the memory device, wherein the cell retention criteria includes information about at least one of (a) a cell retention profiling mechanism associated with an identification of bad memory cells in each memory row, a number of tests required to identify the bad memory cells, or (c) a retention time test to determine if each memory row is refreshed at a normal rate;
initiating a testing of the memory device using the cell retention criteria; and
initializing the at least one data bit of the at least one RCC depending on whether the at least one RCC satisfies the accessed cell retention criteria during the testing.

9. The memory device of claim 8, wherein at least one of the host and the digital verification module are further configured to re-initialize the at least one data bit of the at least one RCC by at least one of:
detecting occurrence of at least one error correction code (ECC) error for the at least one RCC;
performing a scrub method at regular intervals; or
performing the scrub method when temperature of the memory device crosses a temperature threshold.

10. The memory device of claim 7, wherein the digital verification module is further configured to initialize the at least one data bit of the at least one supplemental cell depending on whether the refresh operation is performed on corresponding each memory row in a current refresh cycle.

11. The memory device of claim 10, wherein the digital verification module is further configured to refresh the at least one supplemental cell upon refreshing the at least one memory row connected to the corresponding at least one supplemental cell.

12. The memory device of claim 6, wherein the analog verification module is further configured to:
read at least one comparison voltage stored in the at least one RCC connected to each memory row of the plurality of memory rows;
select at least one reference voltage from a plurality of reference voltages maintained by a voltage generation circuitry based on the read at least one stored comparison voltage of the at least one RCC;
read a voltage of the at least one supplemental cell connected to each memory row of the plurality of memory rows;
compare the read voltage of the at least one supplemental cell with the selected at least one reference voltage using a comparator; and
select the at least one memory row from the plurality of memory rows if the read voltage of the at least one supplemental cell is less than the selected at least one reference voltage.

13. The memory device of claim 12, wherein the at least one RCC is configured to store the comparison voltage depending on whether the at least one RCC satisfies the cell retention criteria during the testing of the memory device.

14. The memory device of claim 12, wherein the at least one RCC is classified into at least one group for storing the at least one comparison voltage.

15. The memory device of claim 3,
wherein the refresh-row selection circuitry is further configured to,
enable the refresh-row selection circuitry to activate the selected at least one memory row of the plurality of memory rows, and
wherein the refresh circuitry is further configured to,
perform the refresh operation on the activated at least one memory row by restoring data bits of the plurality of memory cells on the activated at least one memory row and rewriting read data into the plurality of memory cells.

16. The memory device of claim 15, wherein the refresh controller is further configured to:
enable the refresh circuitry to skip the refresh operation on the at least one memory row of the plurality of memory rows that is not selected for the refresh operation; and
issue the refresh skip indication to the host upon completion of the refresh operation on the selected at least one memory row.

17. The memory device of claim 16, wherein the refresh controller is further configured to:
maintain a refresh counter for tracking the refresh operation performed on the selected at least one memory row and the refresh operation skipped on the at least one memory row that is not selected for the refresh operation;

update the refresh counter on completion of the refresh operation on the selected at least one memory row and skipping of the refresh operation on the at least one memory row that is not selected for the refresh operation; and
determine the completion of the refresh operation performed on the selected at least one memory row using the updated refresh counter.

18. The memory device of claim 3, wherein the refresh controller is further configured to:
perform refresh operations on the selected at least one memory row in at least one of a plurality of memory banks of at least one memory array, a plurality of memory bank groups, or a plurality of memory chips in the memory device using refresh coordination mechanisms.

19. The memory device of claim 3, wherein the refresh controller is further configured to:
receive at least one self-refresh entry command from the host for the plurality of memory rows in response to the memory device being in a self-refresh mode;
recursively perform a plurality of refresh operations internally by selecting the at least one memory row from the plurality of memory rows that are to be refreshed; and
complete the plurality of refresh operations upon receiving a self-refresh exit command from the host.

20. The method of claim 1, wherein the selecting the at least one memory row includes at least one of:
performing a digital reading of the at least one RCC and the at least one supplemental cell; or
performing an analog reading of the at least one RCC and the at least one supplemental cell.

* * * * *